(12) United States Patent
Shin

(10) Patent No.: US 10,884,532 B2
(45) Date of Patent: Jan. 5, 2021

(54) DISPLAY DEVICE AND FLEXIBLE CIRCUIT BOARD

(71) Applicant: Samsung Display Co., Ltd., Yongin-si (KR)

(72) Inventor: Eun Ju Shin, Busan (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 52 days.

(21) Appl. No.: 16/183,170

(22) Filed: Nov. 7, 2018

(65) Prior Publication Data

US 2019/0220122 A1    Jul. 18, 2019

(30) Foreign Application Priority Data

Jan. 12, 2018    (KR) .................. 10-2018-0004270

(51) Int. Cl.
   *G09G 5/00*      (2006.01)
   *G06F 3/041*     (2006.01)
   (Continued)

(52) U.S. Cl.
   CPC ............ *G06F 3/0412* (2013.01); *G06F 3/041* (2013.01); *G06F 3/044* (2013.01); *H01L 27/323* (2013.01);
   (Continued)

(58) Field of Classification Search
   CPC ........ G06F 3/0412; G06F 3/041; G06F 3/044; G06F 2203/04102; H01L 27/323;
   (Continued)

(56) References Cited

U.S. PATENT DOCUMENTS 7,090,506 B2 * 8/2006 Sung .................... G02F 1/13452
                                                       439/581
8,456,384 B2    6/2013 Kim
                  (Continued)

FOREIGN PATENT DOCUMENTS

CN            102955298         3/2013

OTHER PUBLICATIONS

Flexible Circuit Manufacturing, (Copyright 2015), pp. 1-8, Retrieved from the Internet May 8, 2019 <URL:https://www.giltronicassociates.com/flexible-circuit-manufacturing>.
(Continued)

*Primary Examiner* — Jennifer T Nguyen
(74) *Attorney, Agent, or Firm* — Cantor Colburn LLP

(57) ABSTRACT

A display device includes a display structure including a display panel and a touch sensing layer disposed on the display panel, the display panel including a display panel including a display area and a non-display area around the display area, and the touch sensing layer including a first portion overlapping the display area and a second portion overlapping the non-display area, a window structure disposed on the display structure, a bonding layer disposed between the display structure and the window structure, and a touch flexible circuit board electrically connected with the touch sensing layer, wherein the touch flexible circuit board includes a first substrate member connected to the second portion, and a second substrate member provided with an ultraviolet ("UV") transmitting member transmitting UV light emitted from a side of the bonding layer and extending from the first substrate member in a predetermined direction.

21 Claims, 24 Drawing Sheets

(51) Int. Cl.
| | |
|---|---|
| *G06F 3/044* | (2006.01) |
| *H01L 27/32* | (2006.01) |
| *H01L 51/52* | (2006.01) |
| *H01L 51/56* | (2006.01) |
| *H05K 1/18* | (2006.01) |
| *H05K 3/36* | (2006.01) |

(52) U.S. Cl.
CPC ...... *H01L 27/3246* (2013.01); *H01L 27/3276* (2013.01); *H01L 51/5253* (2013.01); *H01L 51/5284* (2013.01); *H01L 51/56* (2013.01); *H05K 1/189* (2013.01); *H05K 3/361* (2013.01); *G06F 2203/04103* (2013.01); *H05K 2201/10128* (2013.01)

(58) Field of Classification Search
CPC .... H01L 27/3246; H05K 1/189; H05K 1/028; H05K 1/0296
USPC .................................................. 345/173, 204
See application file for complete search history.

(56) References Cited

U.S. PATENT DOCUMENTS

| | | |
|---|---|---|
| 2013/0063891 A1 | 3/2013 | Martisauskas |
| 2015/0185527 A1* | 7/2015 | Chang ................. H01L 51/5246 349/12 |
| 2015/0319849 A1* | 11/2015 | Shimizu ............... H05K 3/4007 174/255 |

OTHER PUBLICATIONS

Flexible PCB laminate EEWeb Community, (Copyright 2019), pp. 1-8, Retrieved from the Internet May 7, 2019 <URL:https://www.eeweb.com/quizzes/flexible-pcb-laminate>.

Jin-gang Liu, et al., "Colorless and Transparent high-Temperature-Resistant Polymer Optical Films-Current Status and Potential Applications in Optoelectronic Fabrications", Optoelectronics—Materials and Devices, (Oct. 7, 2015), pp. 57-81.

Extended European Search Report—European Application No. 19150455.4 dated May 16, 2019, references cited within.

* cited by examiner

59: 591, 593, 595, 597

59: 591, 593, 595, 597

59: 591, 593, 595, 597

59b: 591b, 593, 595b, 597

59c: 591c, 593, 595c, 597

59d: 591, 593a, 595, 597a

59e: 591b, 593a, 595b, 597a

59f: 591c, 593a, 595c, 597a

DISPLAY DEVICE AND FLEXIBLE CIRCUIT BOARD

This application claims priority to Korean Patent Application No. 10-2018-0004270, filed on Jan. 12, 2018, and all the benefits accruing therefrom under 35 U.S.C. § 119, the content of which in its entirety is herein incorporated by reference.

BACKGROUND

1. Field

Exemplary embodiments of the invention relate to a display device and a flexible circuit board.

2. Description of the Related Art

A display device visually displays data. The display device generally includes a display panel for displaying an image and a window disposed outside the display panel to protect the display panel. A bonding layer is disposed between the display panel and the window to attach the display panel and the window to each other.

The bonding layer is applied to the window in a liquid phase, and is cured by ultraviolet light after the display panel and the window are laminated.

Recently, the display device may include a touch sensing function interacting with a user in addition to a function of displaying the image. That is, a recent display device may further include a touch sensing layer and a flexible circuit board coupled to the touch sensing layer as well as the display panel, the window, and the bonding layer.

SUMMARY

In a case which a display device includes a touch sensing layer and a flexible circuit board coupled to the touch sensing layer as well as a bonding layer, a transmission of ultraviolet ("UV") light may be inhibited by the flexible circuit board around an area where the flexible circuit board is coupled to the touch sensing layer, and thus there is a possibility that a part of the bonding layer is not sufficiently cured, thereby deteriorating a reliability of the display device.

Exemplary embodiments of the invention provide a display device having improved reliability.

Other exemplary embodiments of the invention provide a flexible circuit board capable of manufacturing a display device having improved reliability.

However, exemplary embodiments of the invention are not restricted to the one set forth herein. The above and other exemplary embodiments of the invention will become more apparent to one of ordinary skill in the art to which the invention pertains by referencing the detailed description of the invention given below.

An exemplary embodiment may be related to a display device. The display device includes a display structure including a display panel and a touch sensing layer disposed on the display panel, the display panel including a display area and a non-display area around the display area, and the touch sensing layer including a first portion overlapping the display area and a second portion overlapping the non-display area, a window structure disposed on the display structure, a bonding layer disposed between the display structure and the window structure, and a touch flexible circuit board electrically connected with the touch sensing layer, wherein the touch flexible circuit board includes a first substrate member connected to the second portion, and a second substrate member provided with an UV transmitting member transmitting UV light emitted from a side of the bonding layer and extending from the first substrate member in a predetermined direction.

An exemplary embodiment may be related to a display device. The display device includes a display structure, a window disposed on the display structure, a light blocking member disposed on one surface of the window facing the display structure, a bonding layer between the window and the display structure, and a flexible circuit board including a first substrate member and a second substrate member provided with an UV transmitting member overlapping the light blocking member and extending from the first substrate member.

An exemplary embodiment may be related to a flexible circuit board. The flexible circuit board includes a first substrate member connected with an electronic device, a second substrate member extending from the first substrate member and provided with an opening member, and an UV transmitting resin layer provided in the opening member.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
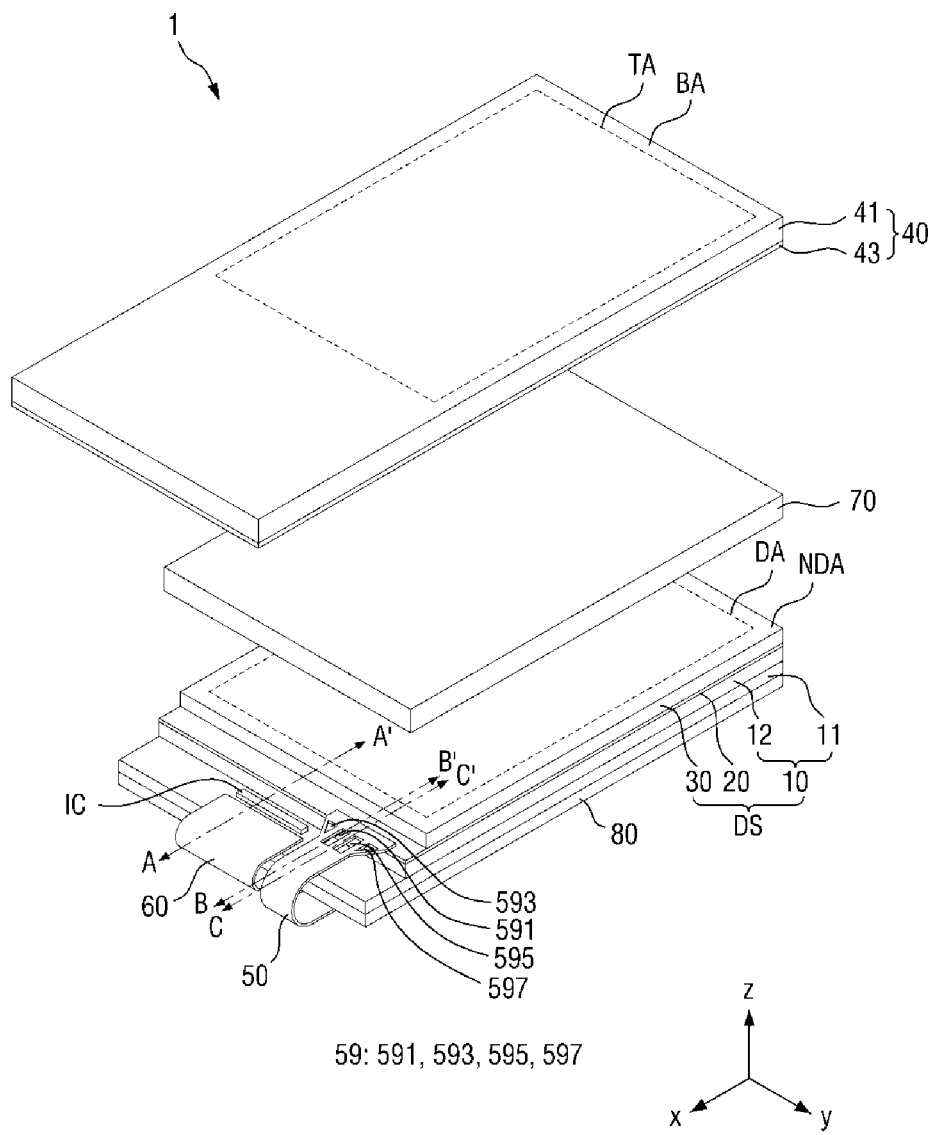
FIG. 1 is an exploded perspective view of an exemplary embodiment of a display device.

The invention will now be described more fully hereinafter with reference to the accompanying drawings, in which preferred embodiments of the invention are shown. This invention may, however, be embodied in different forms and should not be construed as limited to the exemplary embodiments set forth herein. Rather, these embodiments are provided so that this invention will be thorough and complete, and will fully convey the scope of the invention to those skilled in the art. The same reference numbers indicate the same components throughout the specification. In the attached drawing figures, the thickness of layers and regions is exaggerated for clarity. Throughout the specification, the same reference numerals are used for the same or similar parts.

It will also be understood that when a layer is referred to as being "on" another layer or substrate, it may be directly on the other layer or substrate, or intervening layers may also be present. In contrast, when an element is referred to as being "directly on" another element, there are no intervening elements present.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

The invention will be described with reference to perspective views, cross-sectional views, and/or plan views, in which preferred embodiments of the invention are shown. Thus, the profile of an exemplary view may be modified according to manufacturing techniques and/or allowances. That is, the exemplary embodiments of the invention are not intended to limit the scope of the invention but cover all changes and modifications that can be caused due to a change in manufacturing process. Thus, regions shown in the drawings are illustrated in schematic form and the shapes of the regions are presented simply by way of illustration and not as a limitation.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described with reference to the attached drawings.

Figure 2:
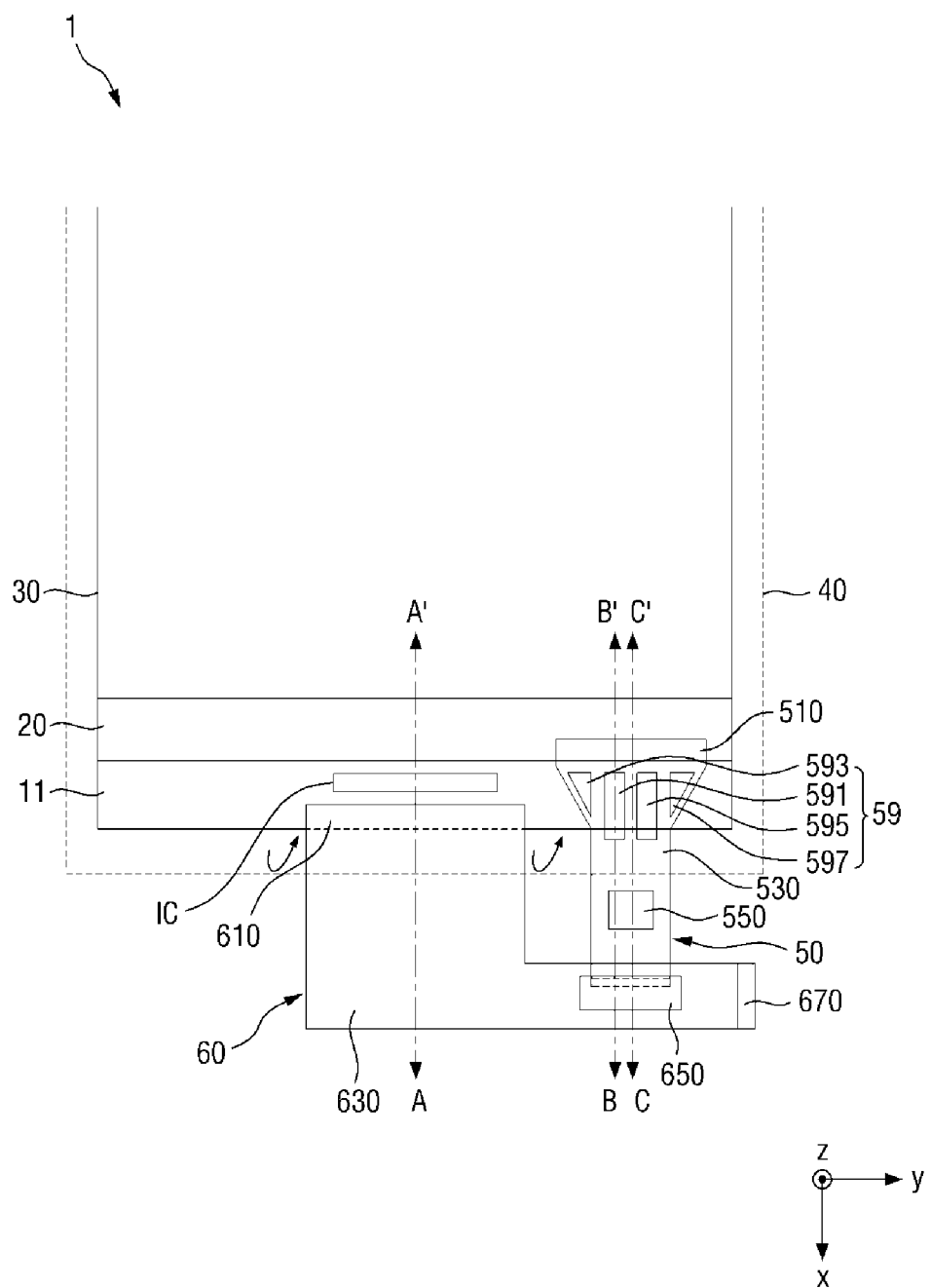
FIG. 2 is a plan view of an exemplary embodiment of a display device.
Figure 3:
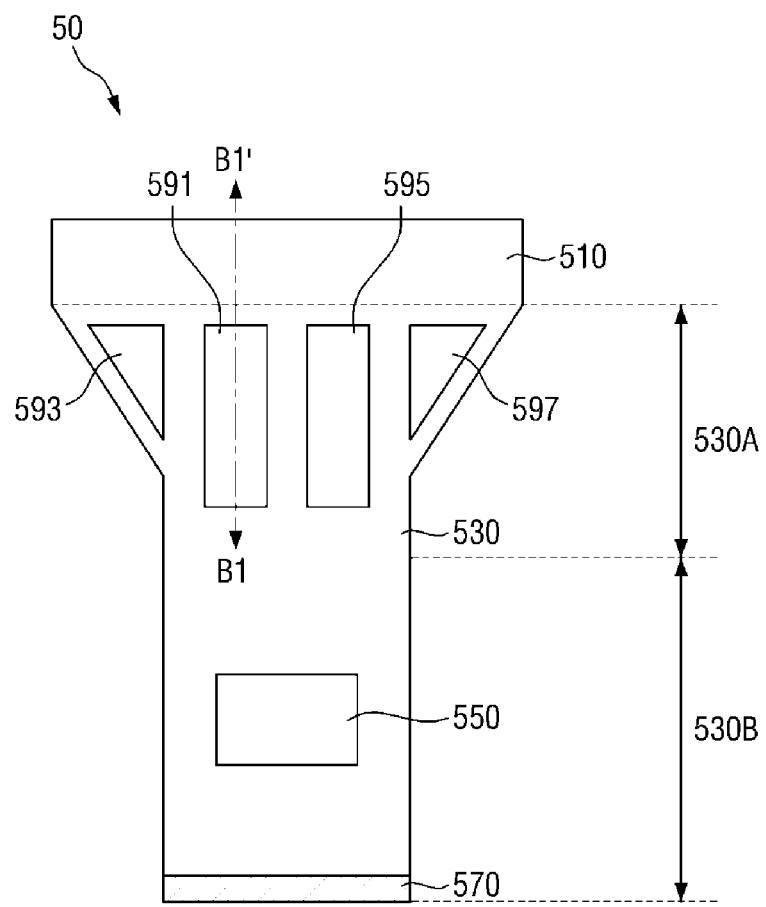
FIG. 3 is a plan view showing an exemplary embodiment of a state before bending of a touch flexible circuit board included in a display device.
Figure 3:
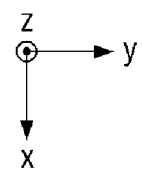
Figure 4:
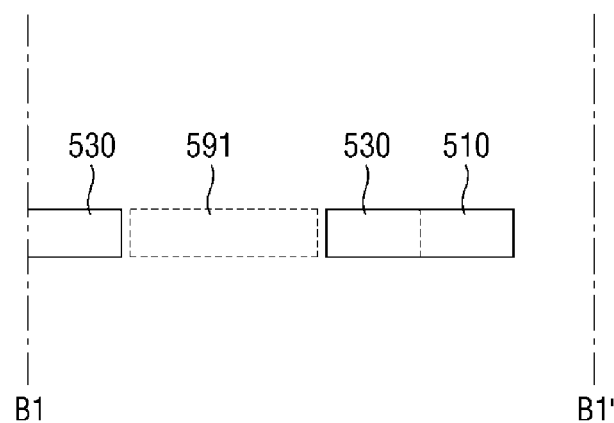
FIG. 4 is a cross-sectional view taken along line B1-B1' in FIG. 3.
Figure 5:
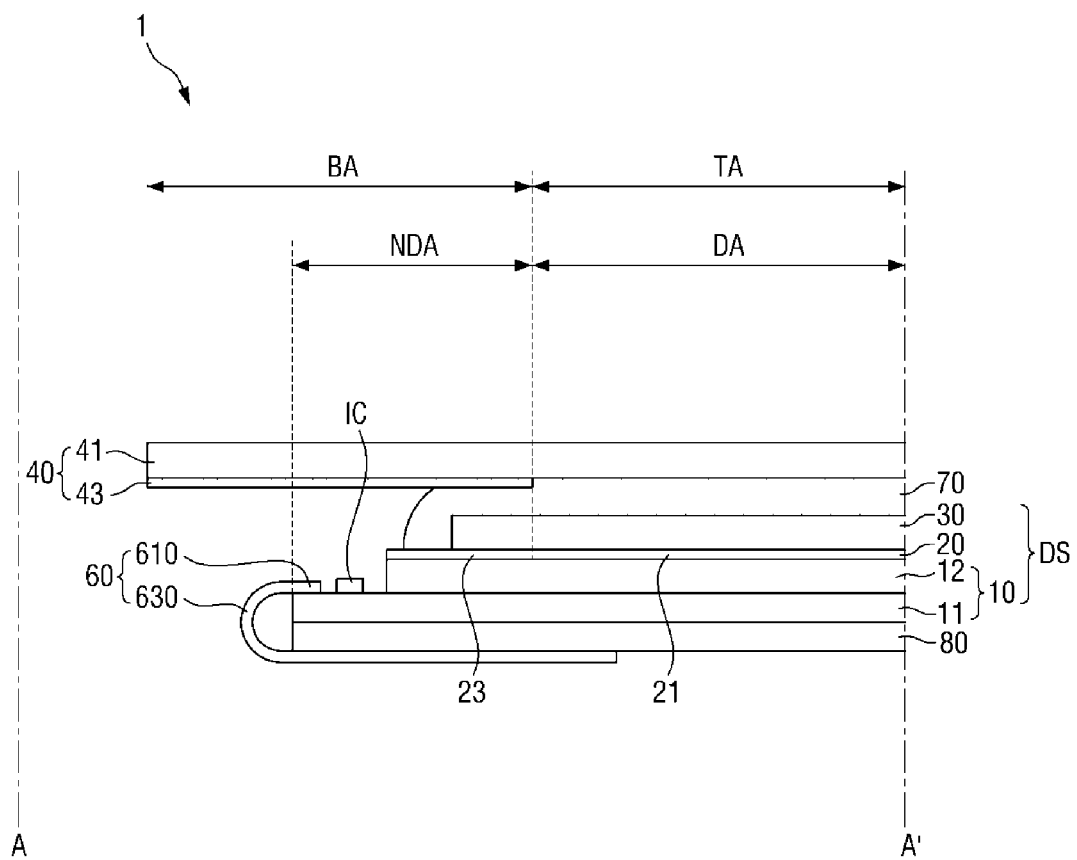
FIG. 5 is a cross-sectional view of the display device of FIGS. 1 and 2 taken along line A-A' in FIGS. 1 and 2.
Figure 6:
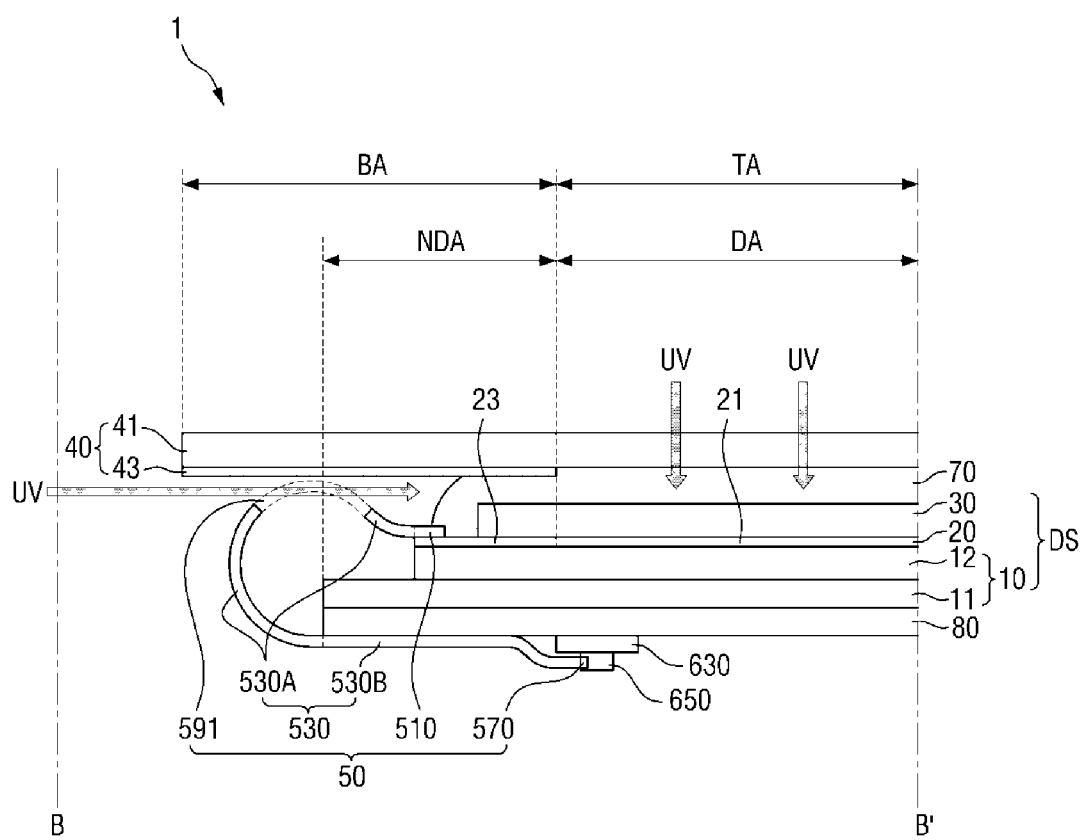
FIG. 6 is a cross-sectional view of the display device of FIGS. 1 and 2 taken along line B-B' in FIGS. 1 and 2.
Figure 7:
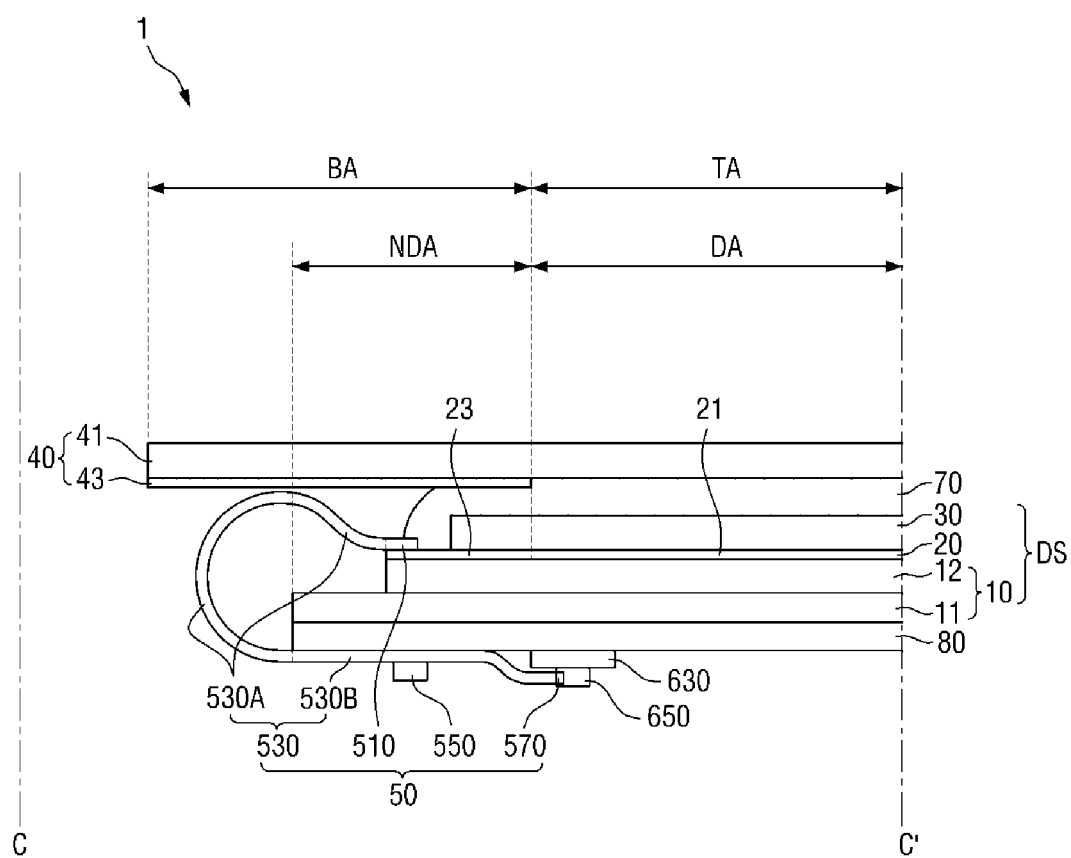
FIG. 7 is a cross-sectional view of the display device of FIGS. 1 and 2 taken along line C-C' in FIGS. 1 and 2.

FIG. 1 is an exploded perspective view of a display device according to an exemplary embodiment, FIG. 2 is a plan view of a display device according to an exemplary embodiment, FIG. 3 is a plan view showing a state before bending of a touch flexible circuit board included in a display device according to an exemplary embodiment, FIG. 4 is a cross-sectional view taken along line B1-B1' in FIG. 3, FIG. 5 is a cross-sectional view of the display device of FIGS. 1 and 2 taken along line A-A' in FIGS. 1 and 2, FIG. 6 is a cross-sectional view of the display device of FIGS. 1 and 2 taken along line B-B' in FIGS. 1 and 2, and FIG. 7 is a cross-sectional view of the display device of FIGS. 1 and 2 taken along line C-C' in FIGS. 1 and 2. For reference, the line B1-B1' in FIG. 3 is a part of the line B-B' in FIGS. 1 and 2.

Referring to FIGS. 1 to 6, a display device 1 according to the illustrated exemplary embodiment may include a display structure DS, a window structure 40 disposed over the display structure DS, a bonding layer 70 disposed between the window structure 40 and the display structure DS, and a touch flexible circuit board 50 connected to the display structure DS. The display device 1 may further include a panel flexible circuit board 60 and a display driver IC, which are connected to the display structure DS. The display device 1 may further include a panel protection member 80 disposed beneath the display structure DS.

The display structure may include a display panel 10 and a touch sensing layer 20, and may further include an optical member 30.

In some exemplary embodiments, the display panel 10 may have a rectangular shape in a plan view. The display panel 10 may include both opposite long sides extending in the first direction x and both opposite short sides extending in the second direction y intersecting the first direction x. The corner where the long side and short side of the display panel 10 meet each other may have a right angle, but is not limited thereto, and may have a curved surface. The corner of the display panel 10 may also be chamfered to reduce the risk of breakage. In addition, the planar shape of the display panel 10 is not limited to the illustrated one, and may include various other shapes such as a circular shape.

The display panel 10 includes a display area DA and a non-display area NDA in a plan view. The display area DA is an area where an image is displayed, and the non-display area NDA is an area where an image is not displayed. In some exemplary embodiments, the non-display area NDA may be disposed around the display area DA, and may surround the display area DA.

Unless defined otherwise, in this specification, the terms "on", "over", "upper side", "upper surface", or "top" means a side facing an arrow in the third directions z intersecting the first direction x and the second direction y based on the drawings, and the terms "beneath", "under", "lower side", "lower surface", or "bottom" means a side opposite to the side facing the arrow in the third direction z based on the drawings.

In view of a laminate structure, the display panel 10 includes a first substrate 11, a second substrate 12 disposed over the first substrate 11 and attached to the first substrate 11, and a display layer disposed between the first substrate 11 and the second substrate 12.

The first substrate 11 is a substrate for supporting the display layer. In an exemplary embodiment, the first substrate 11 may include a polymer film such as glass or plastic.

The display layer is disposed on the first substrate 11 and is located in the display area DA. The display layer may include a plurality of pixels and a plurality of display signal lines. Each pixel may include a thin film transistor ("TFT"), a capacitor, and a light emitting element, which will be described later. The plurality of display signal lines may include a gate line to transmit a gate signal to each pixel and a data line to transmit a data signal to each pixel. The display signal line may extend to the non-display area NDA.

In the non-display area NDA, the display driver IC may be disposed on the first substrate 11. The display driver IC may include at least one of a data driver for applying a data signal to a data line, a gate driver for applying a gate signal to a gate line, and a signal control member for controlling the operations of the data driver and the gate driver. The display driver IC may be electrically connected with the display layer through the display signal line extending to the non-display area NDA or a separate wiring. In some exemplary embodiments, the display driver IC may be located adjacent to the short side of the first substrate 11 in the non-display area NDA.

In some exemplary embodiments, the display driver IC may be disposed (e.g., mounted) on the first substrate 11. In an exemplary embodiment, when the first substrate 11 includes glass, for example, the display driver IC may be disposed (e.g., mounted) on the first substrate 11 in the form of a chip on glass ("COG"). In an alternative exemplary embodiment, when the first substrate 11 includes plastic, for example, the display driver IC may also be disposed (e.g., mounted) on the first substrate 11 in the form of a chip on plastic ("COP"). However, the invention is not limited thereto, and, in another exemplary embodiment, the display driver IC may be disposed on the panel flexible circuit board 60, or may be disposed on a separate main circuit board (not shown). Hereinafter, a case where the display driver IC is disposed (e.g., mounted) on the first substrate 11 in the non-display area NDA will be described as an example.

The second substrate 12 may be an encapsulation substrate for preventing moisture and/or oxygen from penetrating into the display member from the outside. In an exemplary embodiment, the second substrate 12 may include a polymer film such as glass or plastic. The second substrate 12 may be smaller than the first substrate 11, and may cover the first substrate 11 and the display member in the display area DA. In some exemplary embodiments, the second substrate 12 may be attached to the first substrate 11 by a sealant (not shown) applied along the edge of the second substrate 12 in the non-display area NDA.

In another exemplary embodiment, a thin film encapsulation layer in which at least one organic film and at least one inorganic film are alternately laminated one by one may be provided instead of the second substrate 12.

The touch sensing layer 20 may be disposed on the display panel 10. In some exemplary embodiments, the touch sensing layer 20 may obtain the coordinates of a touch input point in a capacitive manner. In the capacitive manner, the coordinate information of the touched point may be obtained in a self capacitive manner or a mutual capacitive manner. Hereinafter, for convenience of explanation, a case where the touch sensing layer 20 has a mutual capacitive structure will be described as an example, but the invention is not limited thereto.

The touch sensing layer 20 may be disposed on the second substrate 12 of the display panel 10, and may include a first portion 21 overlapping the display area DA of the display panel 10 and a second portion 23 overlapping the non-display area NDA of the display panel 10.

The first portion 21 of the touch sensing layer 20 may include a touch electrode (not shown), and the second portion 23 thereof may include a touch signal line (not shown) to transmit and/or receiving a signal to/from the touch electrode and a pad portion provided by the extension of the touch signal line. In some exemplary embodiments, the touch electrode, touch signal line and pad portion of the touch sensing layer 20 may be disposed directly on the second substrate 12. In other words, a separate bonding layer (for example, an adhesive layer) may not be disposed between the touch sensing layer 20 and the second substrate 12.

The optical member 30 may be disposed on the touch sensing layer 20. In some exemplary embodiments, the optical member 30 may include at least one of a phase retardation member and a polarization member. When the optical member 30 includes both the phase retardation member and the polarization member, the polarization member may be disposed on the phase retardation member. External light incident from the outside of the window structure 40 passes through the polarization member to be linearly polarized. The linearly polarized incident light passes through the phase retardation member, is reflected, is incident on the phase retardation member again, passes through the phase retardation member again and then is incident on the polarization member. The linearly polarized incident light passes through the phase retardation member to have a phase difference of about 45°, and is circularly polarized to change its phase. As a result, after the external light passes through the phase retardation member again, most of the external light disappears without passing through the polarization member. In an exemplary embodiment, right-turn circularly polarized light having passed through the phase retardation member is reflected and converted into left-turn circularly polarized light, and the right-turn circularly polarized light and the left-turn circularly polarized light may disappear by destructive interference, for example. Therefore, the external light reflectance of the display device 1 may decrease. However, the invention is not limited thereto, and, in another exemplary embodiment, the optical member 30 may be omitted. In still another exemplary embodiment, the optical member 30 may be disposed in the display panel 10 instead of being disposed on the touch sensing layer 20. Hereinafter, a case where the optical member 30 is disposed on the touch sensing layer 20 will be described as an example.

The panel protection member 80 may be disposed under the display structure DS.

The panel protection member 80 may include at least one of a buffer member and a heat radiation member. The buffer member may include a material having a high shock absorption rate. In an exemplary embodiment, the buffer member may include a polymer resin, such as polyurethane, polycarbonate, polypropylene, or polyethylene, or may be a sponge obtained by foam-molding a rubber liquid, a urethane-based material or an acrylic material. However, the invention is not limited thereto.

In an exemplary embodiment, the heat radiation member may include at least one of graphite, copper (Cu), and aluminum (Al), having good heat radiation characteristics, for example, but is not limited thereto. The heat radiation member not only improves the heat radiation characteristics but also has electromagnetic wave blocking or electromagnetic wave absorbing characteristics. In some exemplary embodiments, the panel protection member 80 may be attached to the display structure DS through an adhesive layer, a double-sided adhesive tape, or the like.

The panel flexible circuit board 60 may be connected to the display panel 10 of the display structure DS. The panel flexible circuit board 60 is a component to which a signal for controlling the display driver IC or the display layer is applied, and the panel flexible circuit board 60 may be connected to the first substrate 11 in the non-display area NDA.

The panel flexible circuit board 60 may include a first panel substrate member 610, a second panel substrate member 630, a connection member 650, and an input member 670.

The first panel substrate member 610 is a portion of the panel flexible circuit substrate 60 connected to the first substrate 11 in the non-display area NDA. The first panel substrate member 610 may be connected to the pad portion (not shown) provided on the first substrate 11, and, in some exemplary embodiments, may be connected to the pad portion through an anisotropic conductive film or the like. However, the invention is not limited thereto, and the first panel substrate member 610 may be connected to the pad portion (not shown) provided on the first substrate 11 by an ultrasonic bonding method or the like, for example. The first panel substrate member 610 may be located at a portion adjacent to one short side of the first substrate 11 extending along the second direction y in the non-display area NDA.

The second panel substrate member 630, which is a portion extending from the first panel substrate member 610, may extend along the first direction x from the first panel substrate member 610 and may be bent toward the lower side of the display structure DS or the lower side of the panel protection member 80. That is, a part of the second panel substrate member 630 may include a bent portion extending from the first panel substrate member 610 and a portion extending from the bent portion and located under the display structure DS or the panel protection member 80.

The connection member 650 may be disposed on the second panel substrate member 630, and, in some exemplary embodiments, may overlap the display structure DS or the panel protection member 80. The connection member 650 may be a portion connected to the touch flexible circuit board 50 to be described later. In some exemplary embodiments, the connection member 650 may be provided in the form of a connector or the like. In an exemplary embodiment, when a connection member 570 included in the touch flexible circuit board 50 is provided in a form of a female connector, the connection member 650 may be provided in a form of a male connector, for example. Further, when the connection member 570 included in the touch flexible circuit board 50 is provided in the form of a male connector, the connection member 650 may be provided in the form of a female connector. However, this is merely an example, and the form of the connection member 650 is not limited thereto.

The input member 670 is a portion receiving a signal from the outside, and, in some exemplary embodiments, may be connected to a main circuit board (not shown). In some exemplary embodiments, the input member 670 may be part of the second panel substrate member 630 or may be disposed on the second panel substrate member 630.

The touch flexible circuit board 50 may be electrically connected to the touch sensing layer 20 of the display structure DS.

The touch flexible circuit board 50 may include a first substrate member 510 and a second substrate member 530, and may further include a touch driver 550 and a connection member 570.

The first substrate member 510 may be connected to the second portion 23 of the touch sensing layer 20, overlapping the non-display region NDA, and, in some exemplary embodiments, may be connected to the pad portion of the second portion 23 of the touch sensing layer 20. In some exemplary embodiments, the first substrate member 510 may be connected to the second portion 23 through an anisotropic conductive film or the like. However, the invention is not limited thereto, and the first substrate member 510 may be connected to the second portion 23 by various methods such as ultrasonic bonding. In some exemplary embodiments, the first substrate member 510 may be located at the same side as a portion of the display structure DS where the first panel substrate member 610 is disposed, but the invention is not limited thereto.

The second substrate member 530 is a portion extending from the first substrate member 510 and not being connected to the touch sensing layer 20. The second substrate member 530 may be bent toward the lower side of the display structure DS or the lower side of the panel protection member 80. That is, the second substrate member 530 may include a bending portion 530A extending from the first substrate member 510 and an extension portion 530B extending from the bending portion 530A. In some exemplary embodiments, the first substrate member 510 and the extension portion 530B may be provided in a substantially flat shape while the touch flexible circuit board 50 is bent, and the bending portion 530A may be provided in a bent shape.

The bending portion 530A may extend along the first direction x from the first substrate member 510, and may not overlap the touch sensing layer 20 in the plan view. Further, the bending portion 530A may overlap a light blocking member 43 of the window structure 40, which will be described later. In some exemplary embodiments, the bending portion 530A may include a portion of which a width in the second direction y varies along the first direction x. In an exemplary embodiment, the bending portion 530A may include a portion of which a width in the second direction y decreases as the portion is farther from the first substrate member 510 along the first direction x, for example.

The extension portion 530B may extend from the bending portion 530A and be located under the display structure DS or the panel protection member 80. In some exemplary embodiments, the extension portion 530B may overlap the second portion 23 of the touch sensing layer 20, and may further overlap the first portion 21 of the touch sensing layer 20 or the display area DA of the display panel 10.

The touch driver 550 may transmit a touch driving signal to the touch sensing layer 20. The touch driver 550 may process a touch sensing signal received from the touch sensing layer 20 to generate touch information such as whether to touch and touch position. In some exemplary embodiments, the touch driver 550 may be disposed (e.g., mounted) on the extension portion 530B.

The second substrate member 530 may be provided with the connection member 570. In some exemplary embodiments, the connection member 570 may be provided on the extension portion 530B of the second substrate member 530. In some exemplary embodiments, the connection member 570 may be connected to the connection member 650 of the panel flexible circuit board 60. Thus, the touch flexible circuit board 50 may receive an external signal input through the input member 670 of the panel flexible circuit board 60 and/or a signal generated/processed by the circuit element of the panel flexible circuit board 60. In some exemplary embodiments, the connection member 570 may be provided in the form of a connector, as described above.

The second substrate member 530 may be provided with an ultraviolet ("UV") transmitting member. The UV transmitting member transmits UV light emitted from the side surface of the bonding layer 70 when curing bonding layer 70. In some exemplary embodiments, the UV transmitting member may be composed of an opening member 59 defined in the second substrate member 530. The opening member 59 may be defined in a form of a hole penetrating the touch flexible circuit board 50, and may be defined in the bending portion 530A of the second substrate member 530. Since the bending portion 530A may overlap the light blocking member 43 of the window structure 40, the opening member 59 may also overlap the light blocking member 43. Further, since the bending portion 530A may not overlap the touch sensing layer 20, the opening member 59 may also not overlap the touch sensing layer 20.

The opening member 59 may include one or more openings. In an exemplary embodiment, the opening member 59 may include a first opening 591 and a second opening 593, and may further include a third opening 595 and a fourth opening 597, for example.

In some exemplary embodiments, the second opening 593, compared to the first opening 591, may be located adjacent to the edge of the bending portion 530A. In other words, the minimum distance along the second direction y between the second opening 593 and the edge of the bending portion 530A may be shorter than the minimum distance along the second direction y between the edge of the first opening 591 and the edge of the bending portion 530A.

When the bending portion 530A includes a portion of which a width in the second direction y varies along the first direction x, the planar shapes of the first opening 591 and the second opening 593 may be different from each other. In an exemplary embodiment, when the first opening 591 has a rectangular shape in which the width of the first opening 591 in the second direction is constant along the first direction x, the second opening 593 may have a triangular shape in which the width of the second opening 593 in the second direction decreases along the first direction x, for example. However, this is merely an example, and, in another exemplary embodiment, the first opening 591 and the second opening 593 may have the same shape.

In some exemplary embodiments, the third opening 595 may have a shape symmetrical to the first opening 591 with respect to an imaginary line extending along the first direction x, and the fourth opening 597 may have a shape symmetrical to the second opening 593 with respect to an imaginary line extending along the first direction x. However, this is merely an example, and the shapes of the third opening 595 and the fourth opening 597 may be variously changed.

Although the case where the opening member 59 includes four openings has been described as an example, the number of openings included in the opening member 59 may be variously changed. In an exemplary embodiment, the number of openings included in the opening member 59 may be one, two, three, five or more, for example.

The window structure 40 is disposed over the display structure DS to protect the display structure DS from external shocks and scratches. The window structure 40 may include a light transmitting area TA and a light blocking area BA in a plan view. The light transmitting area TA is an area through which light is transmitted, and an image provided from the display panel 10 may be transmitted to a user through the light transmitting area TA. The light blocking area BA may be an area for blocking light transmission. In some exemplary embodiments, the light blocking area BA may be located around the light transmitting area TA, and may surround the light transmitting area TA. In some exemplary embodiments, the light transmitting area TA may overlap the display area DA of the display panel 10 and may not overlap the non-display area NDA of the display panel 10. Further, the light blocking area BA may overlap the non-display area NDA of the display panel 10 and may not overlap the display area DA of the display panel 10. That is, the light blocking area BA may cover the non-display area NDA of the display panel 10.

In view of a laminate structure, the window structure 40 may include a window 41 and a light blocking member 43.

The light blocking member 43 may be disposed on one surface of the window 41 facing the display structure DS. The light blocking member 43 may define the light blocking area BA of the window structure 40. In some exemplary embodiments, the light blocking member 43 may be a colored organic layer, and may be disposed on one side of the window 41 by coating, printing, or the like. In another exemplary embodiment, the light blocking member 43 is disposed on a base layer such as a transparent film, and the base layer on which the light blocking member 43 is disposed may be attached to one side of the window 41.

The bonding layer 70 may be disposed between the window structure 40 and the display structure DS to couple the window structure 40 with the display structure DS. The bonding layer 70 may be provided to fill the entire space between the light transmitting area TA of the window structure 40 and the display structure DS. In some exemplary embodiments, the bonding layer 70 may be provided to further fill a part of the space between the light blocking area BA of the window structure 40 and the display structure DS.

The bonding layer 70 may include an UV-curable resin. In some exemplary embodiments, the bonding layer 70 may include an optical clear resin ("OCR"). The bonding layer 70 may be first applied to the window structure 40 in a liquid or paste state, and may be cured by UV light after the display structure DS is laminated.

The bonding layer 70 may be in contact with one surface of the window 41 of the window structure 40. When the optical member 30 is disposed on the touch sensing layer 20, the bonding layer 70 may further be in contact with the upper surface of the optical member 30.

Since the bonding layer 70 may initially have a liquid or paste state, spreading may occur when the display structure DS and the window structure 40 are coupled. Thus, the bonding layer 70 may further be in contact with one surface of the light blocking member 43, and may further be in contact with the side surface of the optical member 30.

In some exemplary embodiments, the bonding layer 70 may further be in contact with a portion of the second portion 23 of the touch sensing layer 20, the portion not overlapping the optical member 30.

In some exemplary embodiments, the bonding layer 70 may further be in contact with the side surface and top surface of the first substrate member 510 of the touch flexible circuit board 50 connected to the second portion 23 of the touch sensing layer 20. In other words, the bonding layer 70 may further cover a part of the first substrate member 510. Accordingly, the connection reliability between the first substrate member 510 and the touch sensing layer 20 may be improved.

When curing the bonding layer 70, UV light may be applied to the bonding layer 70 from the top and side of the display device 1. A portion of the bonding layer 70, overlapping the light transmitting area TA, may be cured by UV light provided from the top of the display device 1. Since the UV light UV provided from the upper portion of the display device 1 is blocked by the light blocking member 43 at a portion of the bonding layer 70 overlapping the light blocking area BA, it is possible to cure a portion of the bonding layer 70 overlapping the light blocking area BA by the irradiation of UV light at the side of the bonding layer 70 or at the side of the display device 1.

Accordingly, when the bonding layer 70 is cured by the irradiation of UV light at the side of the display device 1 or at the side of the bonding layer 70, there is a high possibility that a part of the UV light is blocked by the touch flexible circuit board 50, particularly, the bending portion 530A of the touch flexible circuit board 50. Thus, there is a possibility that a part of the bonding layer 70 is uncured. In the case of the display device 1 according to this exemplary embodiment, the touch flexible circuit board 50 is provided with the opening member 59 as an UV transmitting member, so that the UV light emitted from the side of the bonding layer 70 passes through the opening 59 and is provided to the bonding layer 70. Therefore, it is possible to prevent the bonding layer 70 from being uncured and to improve the curing degree of the bonding layer 70, and thus it is possible to improve the reliability of the display device 1.

In addition, since the second substrate member 530 including the bending portion 530A of the touch flexible circuit board 50 is provided with the opening member 59, there is an advantage that the bending stress of the touch flexible circuit board 50 may be reduced, and thus there is an advantage that a possibility of lifting the touch flexible circuit board 50 or damaging the touch flexible circuit board 50 due to bending stress. Thus, there is an advantage that reliability of the display device 1 may be further improved.

Hereinafter, a touch sensing layer will be described in more detail with reference to FIGS. 8 to 10.

Figure 8:
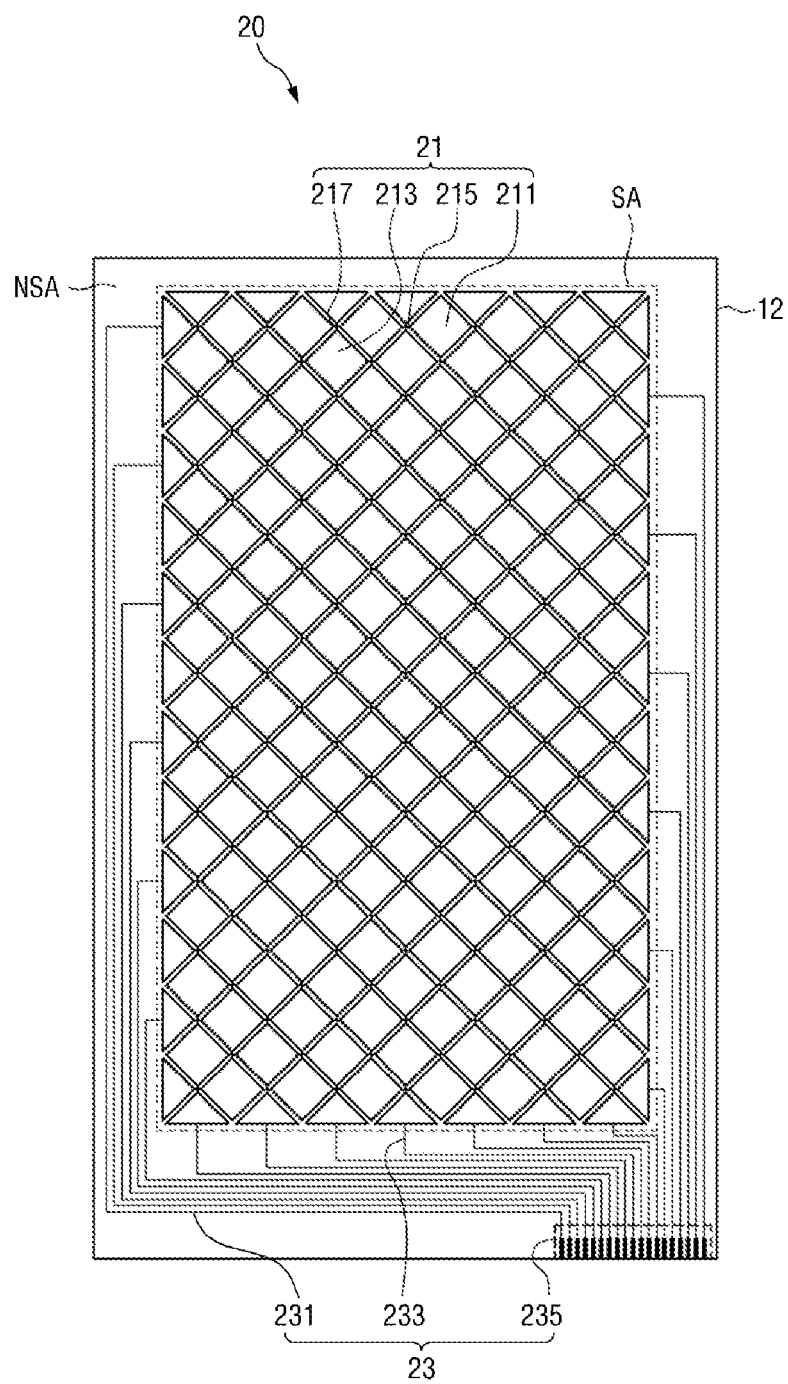
FIG. 8 is a plan view showing an exemplary embodiment of a touch sensing layer of a display device.
Figure 9:
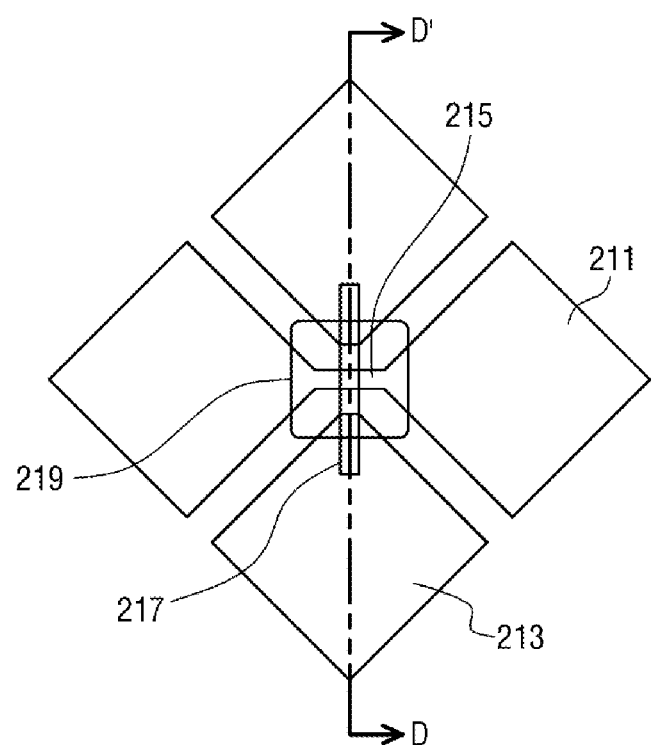
FIG. 9 is a partially enlarged view of the touch sensing layer shown in FIG. 8.
Figure 10:
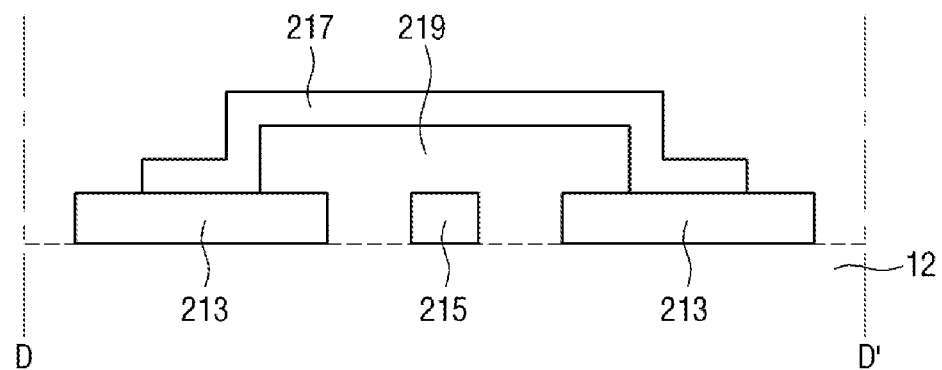
FIG. 10 is a cross-sectional view of the touch sensing layer taken along line D-D' in FIG. 9.

FIG. 8 is a plan view showing a touch sensing layer of a display device according to an exemplary embodiment, FIG. 9 is a partially enlarged view of the touch sensing layer shown in FIG. 8, and FIG. 10 is a cross-sectional view of the touch sensing layer taken along line D-D' in FIG. 9.

Referring to FIG. 8, the touch sensing layer 20 is disposed on the second substrate 12. The touch sensing layer 20 may include a sensing area SA capable of sensing a touch in a plan view and a non-sensing area NSA other than the sensing area SA. The sensing area SA may be an area overlapping the display area DA (refer to FIG. 1) of the display panel 10 (refer to FIG. 1), and the first portion 21 of the touch sensing layer 20 may be located in the sensing area SA. The non-sensing area NSA may be an area that does not sense the touch, and may be an area overlapping the non-display area NDA (refer to FIG. 1) of the display panel 10. The second portion 23 of the touch sensing layer 20 may be located in the non-sensing region NSA.

The first portion 21 of the touch sensing layer 20 includes a plurality of touch electrodes, and the plurality of touch electrodes includes a plurality of first touch electrodes 211 and a plurality of second touch electrodes 213. The first touch electrode 211 and the second touch electrode 213 are separated from each other.

The plurality of first touch electrodes 211 and the plurality of second touch electrodes 213 may be alternately and discretely arranged so as not to substantially overlap each other in the sensing area SA. The plurality of the first touch electrodes 211 may be arranged in the column direction and row direction, respectively, and the plurality of the second touch electrodes 213 may be arranged in the column direction and row direction, respectively.

The first touch electrode 211 and the second touch electrode 213 may be located on the same layer, and may also be located on different layers. In an exemplary embodiment, each of the first touch electrode 211 and the second touch electrode 213 may have a rectangular or rhombic shape, for example, but is not limited thereto. Each of the first touch electrode 211 and the second touch electrode 213 may have various shapes, such as protrusions for improving the sensitivity of the touch sensing layer 20.

The plurality of first touch electrodes 211 arranged in the same row or column may be connected to each other inside or outside the sensing area SA, or may be separated from each other inside or outside the sensing area SA. Similarly, at least some of the plurality of second touch electrodes 213 arranged in the same row or column may be connected to each other inside or outside the sensing area SA, or may be separated from each other inside or outside the sensing area SA. In an exemplary embodiment, as shown in FIG. 8, when the plurality of first touch electrodes 211 arranged in the same row are connected to each other inside the sensing area SA, the plurality of second touch electrodes 213 arranged in the same column may be connected to each other in the sensing area SA, for example. More specifically, the plurality of first touch electrodes 211 arranged in each row is connected to each other through a first connection member 215, and the plurality of second touch electrodes 213 arranged in each column is connected to each other through a second connection member 217.

Referring to FIGS. 9 and 10, the first connection member 215 connecting the first touch electrodes 211 adjacent to each other may be located in the same layer as the first touch electrode 211, and may include the same material as that of the first touch electrode 211. That is, the first touch electrode 211 and the first connection member 215 may be unitary with each other, and may be simultaneously patterned.

The second connection member 217 connecting the second touch electrodes 213 adjacent to each other may be located on the different layer from the second touch electrode 213. That is, the second touch electrode 213 and the first connection member 215 may be separated from each other and separately patterned. The second touch electrode 213 and the second connection member 217 are connected to each other through direct contact.

An insulating layer 219 is disposed between the first connection member 215 and the second connection member 217 to isolate the first connection member 215 and the second connection member 217 from each other. As shown in FIGS. 9 and 10, the insulating layer 219 may be a plurality of independent island-shaped insulators disposed for each intersection of the first connection member 215 and the second connection member 217. The insulating layer 219 may expose at least a part of the second touch electrode 213 such that the second connection member 217 is connected to the second touch electrode 213. The edge of the insulating layer 219 may have a rounded shape or a polygonal shape. In an exemplary embodiment, the insulating layer 219 may include SiOx, SiNx, and/or SiOxNy, for example.

The insulating layer 219 may be entirely provided, and the insulating layer 219 located on a part of the second touch electrode 213 may be removed for connection with the second touch electrode 213 adjacent in the column direction.

Unlike those shown in FIGS. 9 and 10, the second connection member 217 connecting the second touch electrodes 213 adjacent to each other may be located in the same layer as the first touch electrode 211 and may be unitary with the first touch electrode 211, and the first connection member 215 connecting the first touch electrodes 211 adjacent to each other may be located on a different layer from the first touch electrode 211.

Referring back to FIG. 8, the second portion 23 of the touch sensing layer 20 may include a first touch signal line 231 and a second touch signal line 233.

The first touch electrodes 211 connected to each other for each row may be electrically connected to the touch driver 550 through the first touch signal line 231, and the second touch electrodes 213 connected to each other for each column may be electrically connected to the touch driver 550 through the second touch signal line 233. The end portions of the first touch signal line 231 and the second touch signal line 233 may form a pad portion 235 on the second substrate 12.

The first touch electrode 211 and the second touch electrode 213 have a predetermined transmittance or more such that light emitted from the display layer of the display panel 10 is transmitted. In an exemplary embodiment, the first touch electrode 211 and the second touch electrode 213 may include a thin metal layer such as indium tin oxide ("ITO"), indium zinc oxide ("IZO"), or silver nanowires (AgNw), or may include a transparent conductive material such as metal mesh or carbon nanotubes ("CNT"). However, the invention is not limited thereto. The materials of the first connection member 215 and the second connection member 217 are the same as those of the first touch electrode 211 and the second touch electrode 213.

In an exemplary embodiment, the first touch signal line 231 and the second touch signal line 233 may include the transparent conductive material included in the first touch electrode 211 and the second touch electrode 213, or may include a low-resistance material such as molybdenum (Mo), silver (Ag), titanium (Ti), copper (Cu), aluminum (Al), or molybdenum/aluminum/molybdenum (Mo/Al/Mo).

The first touch electrode 211 and the second touch electrode 213 adjacent to each other form a mutual capacitance, and any one of the first touch electrode 211 and the second touch electrode 213 may output a change in mutual capacitance generated by an external object as a touch sensing signal.

In some exemplary embodiments, the first portion 21 and second portion 23 of the touch sensing layer 20 may be disposed on the second substrate 12 by patterning. In an exemplary embodiment, the first touch electrode 211, the second touch electrode 213, the first touch signal line 231, the second touch signal line 233, and the pad portion 235 may be disposed directly on the second substrate 12, for example. When the insulating layer disposed directly on the second substrate 12, the first touch electrode 211, the second touch electrode 213, the first touch signal line 231, the second touch signal line 233, and the pad portion 235 may disposed directly on the insulating layer.

Hereinafter, a display layer of a display device according to an exemplary embodiment of the invention will be described in detail with reference to FIGS. 11 to 13.

Figure 11:
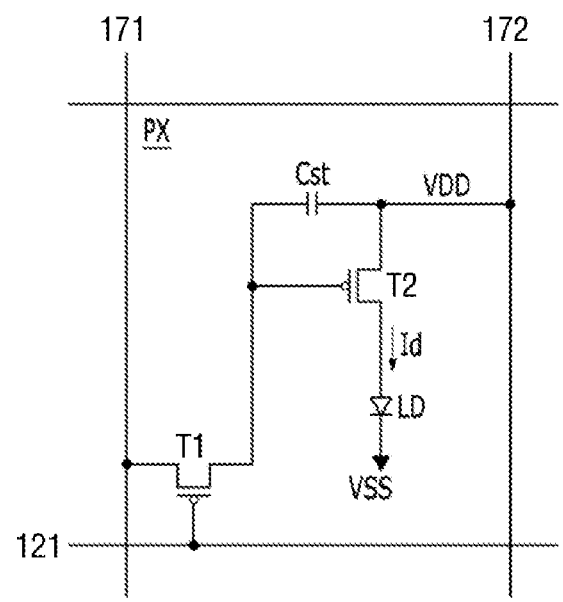
FIG. 11 is an equivalent circuit diagram of an exemplary embodiment of one pixel of a display device.
Figure 12:
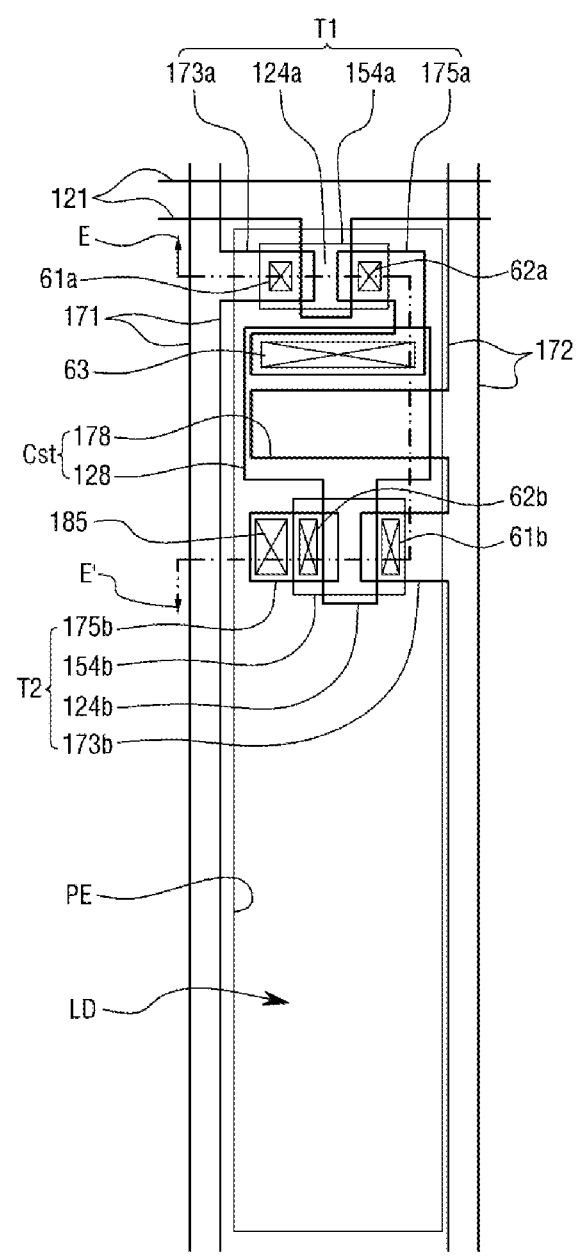
FIG. 12 is an exemplary plan view of an exemplary embodiment of one pixel of a display device.
Figure 13:
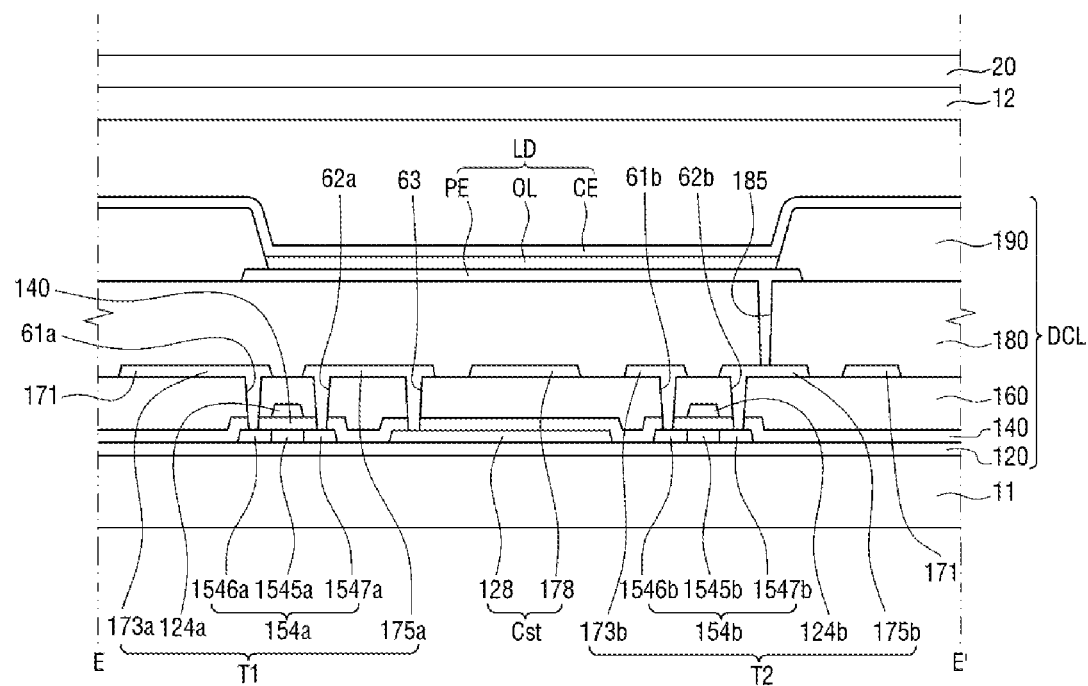
FIG. 13 is a cross-sectional view taken along line E-E' in FIG. 12.

FIG. 11 is an exemplary equivalent circuit diagram of one pixel included in a display layer in a display device according to an exemplary embodiment, FIG. 12 is an exemplary plan view of one pixel of a display device according to an exemplary embodiment, and FIG. 13 is a cross-sectional view taken along line E-E' in FIG. 12.

As described above, the display layer DCL includes a plurality of pixels PX, and one pixel PX includes a switching TFT T1, a driving TFT T2, a storage capacitor Cst, and a light-emitting element LD.

Specifically, referring to FIG. 11, the display device includes a plurality of signal lines 121, 171, and 172 and a plurality of pixels PX connected to the signal lines and arranged in a matrix form.

The signal lines include a plurality of gate lines 121 which transmit a gate signal (or a scanning signal), a plurality of data lines 171 which transmit a data signal, and a plurality of driving voltage lines 172 which transmit a driving voltage VDD. The gate lines 121 extend substantially in the row direction and are substantially parallel to each other, the data lines 171 extend substantially in the column direction and are substantially parallel to each other, and the driving voltage lines 172 extend substantially in the column direction and are substantially parallel to each other. The gate signal and the data signal may be applied through the display driver IC.

The switching TFT T1 has a control terminal, an input terminal, and an output terminal. The control terminal is connected to the gate line 121, the input terminal is connected to the data line 171, and the output terminal is connected to the driving TFT T2. The switching TFT T1 transmits a data signal applied to the data line 171 to the driving TFT T2 in response to a gate signal applied to the gate line 121.

The driving TFT T2 also has a control terminal, an input terminal, and an output terminal. The control terminal is connected to the switching TFT T1, the input terminal is connected to the driving voltage line 172, and the output terminal is connected to the light emitting element LD. The driving TFT T2 supplies an output current Id of which intensity varies according to the voltage applied between the control terminal and the output terminal of the driving TFT T2.

The storage capacitor Cst is connected between the control terminal and input terminal of the driving TFT T2. The storage capacitor Cst charges the data signal applied to the control terminal of the driving TFT T2 and holds this state even after the switching TFT T1 is turned off.

The light-emitting element LD, which may be an organic light-emitting diode, includes a pixel electrode connected to the output terminal of the driving TFT T2 and a common electrode connected to a common voltage VSS. The light emitting element LD emits light with different intensity according to the output current Id of the driving TFT T2 to display an image.

Each of the switching TFT T1 and the driving TFT T2 may be an n-channel field effect transistor ("FET") or a p-channel FET. The connection relationship of the switching TFT T1, the driving TFT T2, the storage capacitor Cst, and the light-emitting element LD may be changed.

Referring to FIGS. 12 and 13, the display device according to the illustrated exemplary embodiment includes a display layer DCL disposed on the first substrate 11, and the display layer DCL includes a light-emitting element LD.

The display layer DCL includes a buffer layer 120, a switching semiconductor layer 154a, a driving semiconductor layer 154b, a gate insulating layer 140, a gate line 121, a first capacitor plate 128, an interlayer insulating layer, a data line 171, a driving voltage line 172, a switching drain electrode 175a, a driving drain electrode 175b, a protection film 180, a pixel defining film 190, and a light-emitting element LD.

In an exemplary embodiment, the buffer layer 120 may be disposed on the first substrate 11, may include silicon nitride (SiNx), silicon oxide (SiOx), or silicon oxynitride (SiOxNy), for example, and may be provided as a single layer or a multilayer. The buffer layer 120 serves to prevent the penetration of impurities, moisture, or external air deteriorating the characteristics of a semiconductor and to flatten a surface.

The switching semiconductor layer 154a and the driving semiconductor layer 154b are disposed on the buffer layer 120 to be apart from each other. The switching semiconductor layer 154a and the driving semiconductor layer 154b include polycrystalline silicon, and include channel regions 1545a and 1545b, source regions 1546a and 1546b, and drain regions 1547a and 1547b. The source regions 1546a and 1546b and the drain regions 1547a and 1547b are disposed on both opposite sides of the channel regions 1545a and 1545b, respectively.

The channel regions 1545a and 1545b include polycrystalline silicon not doped with impurities, that is, an intrinsic semiconductor. The source regions 1546a and 1546b and the drain regions 1547a and 1547b include polycrystalline silicon doped with conductive impurities, that is, an impurity semiconductor.

A gate insulating layer 140 is disposed on the channel regions 1545a and 1545b of the switching semiconductor layer 154a and the driving semiconductor layer 154b. In an exemplary embodiment, the gate insulating layer 140 may be a single layer or multilayer including at least one of silicon nitride and silicon oxide, for example.

A gate line 121 is disposed on the gate insulating layer 140, and a first capacitor plate 128 is disposed on the buffer layer 120.

The gate line 121 includes a switching gate electrode 124a extending in the lateral direction, transmitting a gate signal, and protruding from the gate line 121 toward the switching semiconductor layer 154a. The first capacitor plate 128 includes a driving gate electrode 124b protruding from the first capacitor plate 128 toward the driving semiconductor layer 154b. The switching gate electrode 124a and the driving gate electrode 124b overlap the channel regions 1545a and 1545b, respectively.

An interlayer insulating layer 160 is disposed on the gate line 121, the first capacitor plate 128, and the buffer layer 120. A switching source contact hole 61a and a switching drain contact hole 62a are defined in the interlayer insulating layer 160 to expose the source region 1546a and the drain region 1547a of the switching semiconductor layer 154a, respectively. Further, a driving source contact hole 61b and a driving drain contact hole 62b are defined in the interlayer insulating layer 160 to expose the source region 1546b and the drain region 1547b of the driving semiconductor layer 154b, respectively.

A data line 171, a driving voltage line 172, a switching drain electrode 175a, and a driving drain electrode 175b are disposed on the interlayer insulating layer 160.

The data line 171 extends in a direction (e.g., vertical direction in FIG. 12) crossing the gate line 121 and includes a switching source electrode 173a which extends in a direction (e.g., horizontal direction in FIG. 12) parallel to the gate line 121, transmits a data signal and protrudes from the data line 171 toward the switching semiconductor layer 154a.

The driving voltage line 172 transmits a driving voltage, is separated from the data line 171, and extends in the same direction (e.g., vertical direction in FIG. 12) as that of the data line 171. The driving voltage line 172 includes a driving source electrode 173b protruding from the driving voltage line 172 toward the driving semiconductor layer 154b and a second capacitor plate protruding from the driving voltage line 172 to overlap the first capacitor plate 128. The first capacitor plate 128 and the second capacitor plate 178 may form a storage capacitor Cst by the interlayer insulating layer 160 as a dielectric.

The switching drain electrode 175a faces the switching source electrode 173a, and the driving drain electrode 175b faces the driving source electrode 173b.

The switching source electrode 173a and the switching drain electrode 175a are electrically connected to the source region 1546a and drain region 1547a of the switching semiconductor layer 154a through the switching source contact hole 61a and the switching drain contact hole 62a. Further, the switching drain electrode 175a extends to be electrically connected to the first capacitor plate 128 and the driving gate electrode 124b through the first contact hole 63 defined in the interlayer insulating layer 160.

The driving source electrode 173b and the driving drain electrode 175b are electrically connected to the source region 1546b and drain region 1547b of the driving semiconductor layer 154b through the driving source contact hole 61b and the driving drain contact hole 62b.

The switching semiconductor layer 154a, the switching gate electrode 124a, the switching source electrode 173a, and the switching drain electrode 175a constitute the switching TFT T1. The driving semiconductor layer 154b, the driving gate electrode 124b, the driving source electrode 173b, and the driving drain electrode 175b constitute the driving TFT T2.

A protection film 180 is disposed on the data line 171, the driving voltage line 172, the switching drain electrode 175a, and the driving drain electrode 175b. A second contact hole 185 is defined in the protection film 180 to expose the driving drain electrode 175b.

A light-emitting element LD and a pixel defining film 190 are disposed on the protection film 180.

The light-emitting element LD includes a pixel electrode PE, an organic light-emitting layer OL, and a common electrode CE.

The pixel electrode PE is disposed on the protection film 180, and is electrically connected to the driving drain electrode 175b of the driving TFT T2 through the second contact hole 185 defined in the protection film 180. The pixel electrode PE serves as an anode of the light-emitting element LD.

In an exemplary embodiment, the pixel electrode PE may include a transparent conductive material such as ITO, IZO, ZnO, or $In_2O_3$, or may include a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel defining film 190 is disposed on the edge of the pixel electrode PE and the protection film 180. An opening for exposing the pixel electrode PE is defined in the pixel defining film 190. In an exemplary embodiment, the pixel defining film 190 may include a resin such as polyacrylate or polyimide.

An organic light-emitting layer OL is disposed on the pixel electrode PE in the opening of the pixel defining film 190. The organic light-emitting layer OL includes a light emitting layer and includes a plurality of layers including at least one of a hole injection layer ("HIL"), a hole transport layer ("HTL"), an electron transport layer ("ETL"), and an electron injection layer ("EIL"). When the organic light-emitting layer OL includes all the layers, the HIL may be disposed on the pixel electrode PE, which is an anode electrode, and the HTL, the light emitting layer, the ETL, and the EIL may be sequentially laminated on the HIL.

The organic light-emitting layer OL may include a red organic light-emitting layer emitting red light, a green organic light-emitting layer emitting green light, and a blue organic light-emitting layer emitting blue light. The red organic light-emitting layer, the green organic light-emitting layer, and the blue organic light-emitting layer are provided in a red pixel, a green pixel, and a blue pixel, respectively, to realize a color image. The organic light-emitting layer OL may realize a color image by laminating a red organic light-emitting layer, a green organic light-emitting layer and a blue organic light-emitting layer in a red pixel, a green pixel and a blue pixel, respectively, and forming a red color filter, a green color filter and a blue color filter for each pixel.

The common electrode CE is disposed on the pixel defining film 190 and the organic light-emitting layer OL. In an exemplary embodiment, the common electrode CE may include a transparent conductive material such as ITO, IZO, ZnO, or $In_2O_3$, or may include a metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode CE serves as a cathode of the light-emitting element LD.

As described above, the second substrate 12 may be disposed on the display layer DCL, and the touch sensing layer 20 may be disposed on the second substrate 12.

Figure 14:
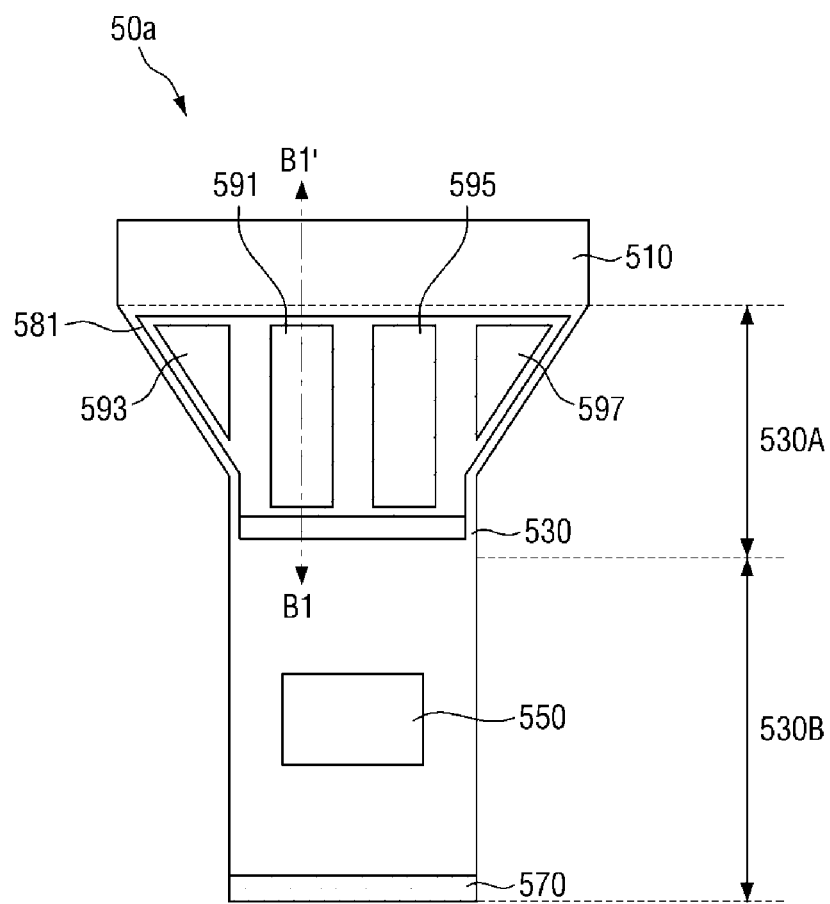
FIG. 14 is a plan view showing another exemplary embodiment of a state before bending of a touch flexible circuit board included in a display device.
Figure 15:
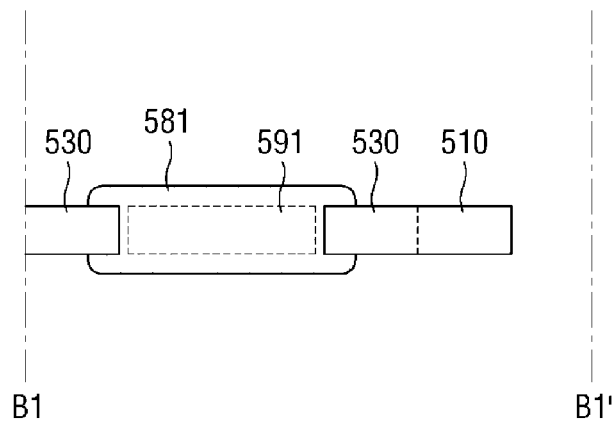
FIG. 15 is a cross-sectional view of the touch flexible circuit board taken along B1-B1' in FIG. 14.
Figure 16:
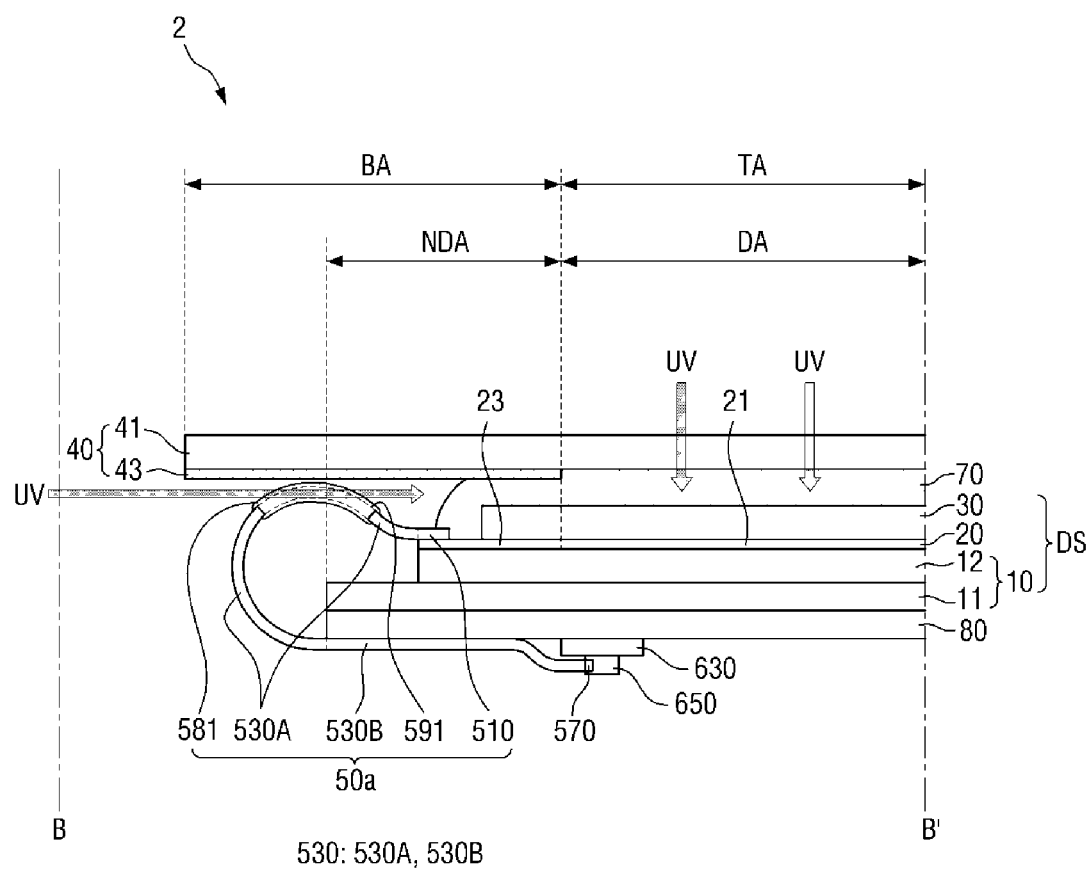
FIG. 16 is a cross-sectional view of another exemplary embodiment of a display device taken along line B-B' in FIGS. 1 and 2.

FIG. 14 is a plan view of a touch flexible circuit board included in a display device according to another exemplary embodiment, FIG. 15 is a cross-sectional view of the touch flexible circuit board taken along B1-B1' in FIG. 14, and FIG. 16 is a cross-sectional view of a display device according to another exemplary embodiment taken along line B-B' in FIGS. 1 and 2.

Referring to FIGS. 14 to 16, a display device 2 according to this exemplary embodiment is different from the display device 1 described above with reference to FIGS. 1 to 13 in that it includes a touch flexible circuit board 50a, and other components of the display device 2 are substantially the same as those of the display device 1. Therefore, duplicate contents are omitted, and differences are mainly described.

The touch flexible circuit board 50a is different from the touch flexible circuit board 50 shown in FIGS. 3 to 7 in that it further include a UV transmitting resin layer 581 provided in the opening member 59 as a UV transmitting member in addition to the opening member 59. Other components of the touch flexible circuit board 50a are substantially the same as or similar to those of the touch flexible circuit board 50.

The UV transmitting resin layer 581 may include a material that transmits UV light. Therefore, when curing the bonding layer 70, the UV light UV emitted from the side surface of the display device 2 may be provided to the bonding layer 70 through the opening member 59 and the UV transmitting resin layer 581. In an exemplary embodiment, the UV transmitting material may include a transparent organic material such as acrylic resin, for example, but is not limited thereto. In another exemplary embodiment, the UV transmitting resin layer 581 may include a material that blocks visible light and transmits UV light.

When the opening member 59 includes the first opening 591, the second opening 593, the third opening 595, and the fourth opening 597, the UV transmitting resin layer 581 may fill each of the first opening 591, the second opening 593, the third opening 595, and the fourth opening 597. In some exemplary embodiment, the UV transmitting resin layer 581 may be in contact with any one of the upper surface and lower surface of the second substrate member 530. Further, in some exemplary embodiments, as shown in the drawings, the UV transmitting resin layer 581 may be in contact with both the upper surface and lower surface of the second substrate member 530.

In some exemplary embodiments, as shown in FIG. 14, the UV transmitting resin layer 581 may be provided in the form of being applied to the entire bending portion 530A. Since the UV-transmitting resin layer 581 is applied to the bending portion 530A, when the bending portion 530A is bent, not only tensile force but also compressive force from the UV transmitting resin layer 581 are applied to the touch flexible circuit board 50a at the same time. As a result, the tensile force and the compressive force are canceled each other, and the stress of the touch flexible circuit board 50a is minimized, so that it is possible to prevent the touch flexible circuit board 50a or the components (for example, wiring) provided in the touch flexible circuit board 50a from being damaged by bending.

Figure 17:
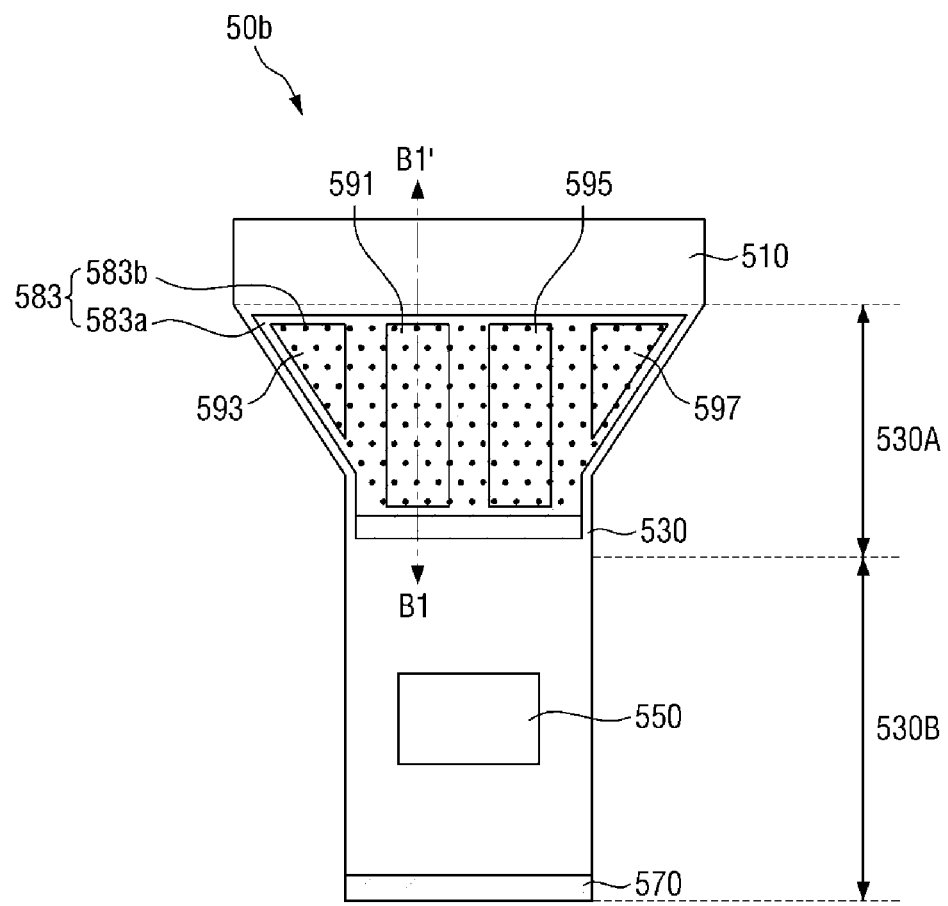
FIG. 17 is a plan view showing another exemplary embodiment of a state before bending of a touch flexible circuit board included in a display device.
Figure 17:
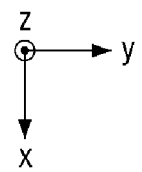
Figure 18:
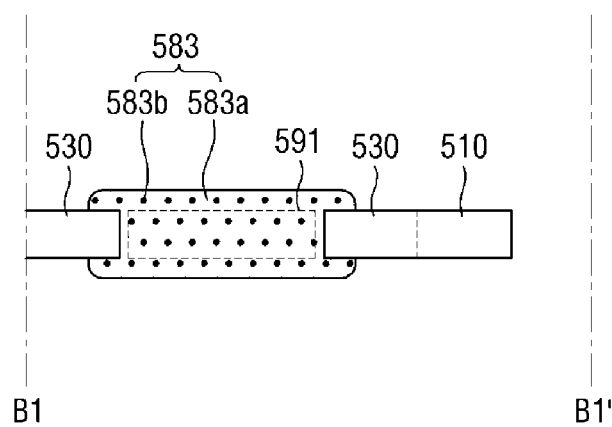
FIG. 18 is a cross-sectional view of the touch flexible circuit board taken along B1-B1' in FIG. 17.
Figure 19:
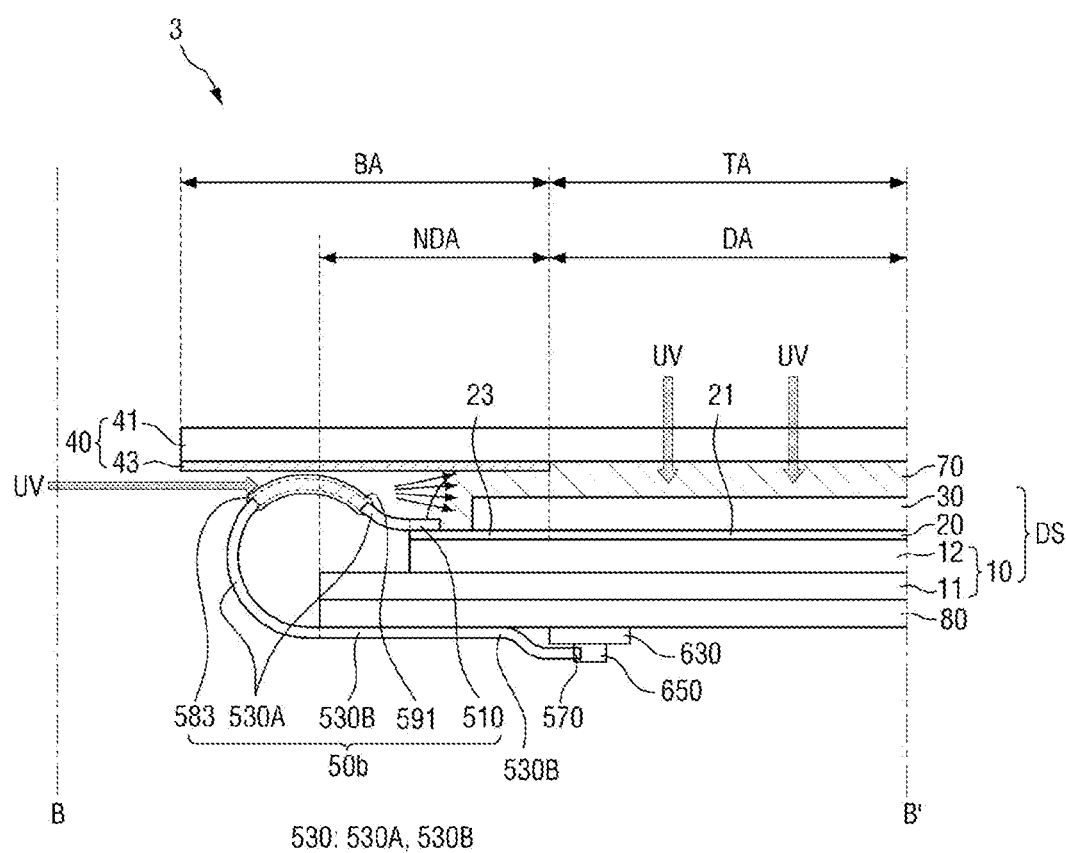
FIG. 19 is a cross-sectional view of still another exemplary embodiment of a display device taken along line B-B' in FIGS. 1 and 2.

FIG. 17 is a plan view of a touch flexible circuit board included in a display device according to still another exemplary embodiment, FIG. 18 is a cross-sectional view of the touch flexible circuit board taken along B1-B1' in FIG. 17, and FIG. 19 is a cross-sectional view of a display device according to still another exemplary embodiment taken along line B-B' in FIGS. 1 and 2.

Referring to FIGS. 17 to 19, a display device 3 according to this exemplary embodiment is different from the display device 2 described above with reference to FIGS. 14 to 16 in that it includes a touch flexible circuit board 50b, and other components of the display device 3 are substantially the same as those of the display device 2. Therefore, duplicate contents are omitted, and differences are mainly described.

Referring to FIGS. 17 to 19, the touch flexible circuit board 50b is different from the touch flexible circuit board 50a shown in FIGS. 14 to 16 in that an UV transmitting resin layer 583 includes an UV transmitting resin 583a and light-scattering particles 583b dispersed in the UV transmitting resin 583a. Besides, a description of the UV transmitting resin layer 583 is substantially the same as or similar to that of the UV transmitting resin layer 581 described above with reference to FIGS. 14 to 16. Therefore, hereinafter, differences will be mainly described.

The UV transmitting resin layer 583 may include an UV transmitting resin 583a and light-scattering particles 583b dispersed in the UV transmitting resin 583a.

The UV transmitting resin 583a may be an UV transmitting material. The UV transmitting material may include a transparent organic material such as acrylic resin, but is not limited thereto. The UV transmitting resin layer 581 may be a material that blocks visible light and transmits UV light.

The light-scattering particles 583b may scatter or diffuse incident light. In an exemplary embodiment, the light-scattering particles 583b may include at least one of $ZrO_2$, $TiO_2$, $Al_2O_3$, MgO, and $SiO_2$, for example.

The UV light emitted from the side of the display device 3 in the process of curing the bonding layer 70 may be provided to the bonding layer 70 through the opening member 59 and the UV transmitting resin layer 583. Further, since the UV transmitting resin layer 583 further includes the light-scattering particles 583b, the UV light having passed through the UV transmitting resin layer 583 may be scattered and diffused by the light-scattering particles 583b. Thus, uniform UV light may be provided to a portion of the bonding layer, overlapping the light blocking member 43, and the curing reliability of the bonding layer 70 may be improved.

In addition to the above-described structure, the structure of the touch flexible circuit board may be variously changed.

FIGS. 20 to 25 are plan views showing touch flexible circuit boards according to modification embodiments of FIG. 3. Hereinafter, touch flexible circuit boards according to modification embodiments will be described with reference to FIGS. 20 to 25.

Figure 20:
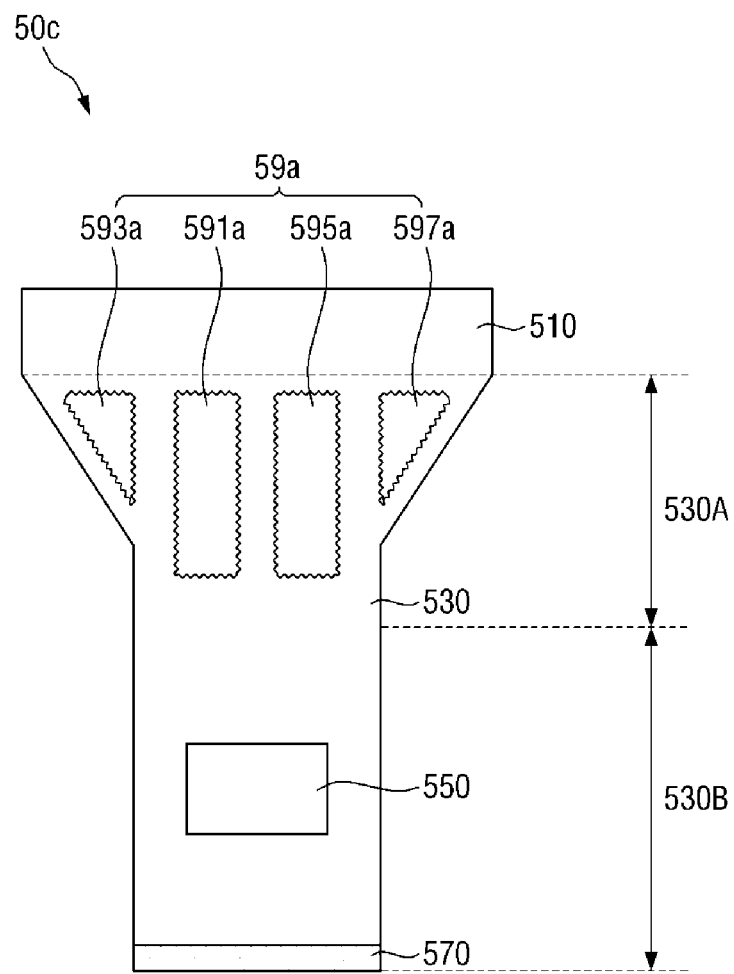
FIGS. 20 to 25 are plan views showing states before bending of touch flexible circuit boards according to modified exemplary embodiments of FIG. 3.

Referring to FIG. 20, in a touch flexible circuit board 50c according to this modification embodiment unlike the touch flexible circuit board 50 shown in FIG. 3, the edge of an opening included in an opening member 59a may be provided in a concavo-convex shape.

In an exemplary embodiment, in a plan view, the edge of a first opening 591a, the edge of a second opening 593a, the edge of a third opening 595a, and the edge of a fourth opening 597a, which are included in an opening member 59a, may be unevenly provided, for example. Accordingly, when UV light is laterally radiated in the process of curing the bonding layer 70, the UV light transmitted through the opening member 59a may be scattered/diffused at the edge where the irregularities are provided, and thus uniform UV light may be provided to the bonding layer 70.

Figure 21:
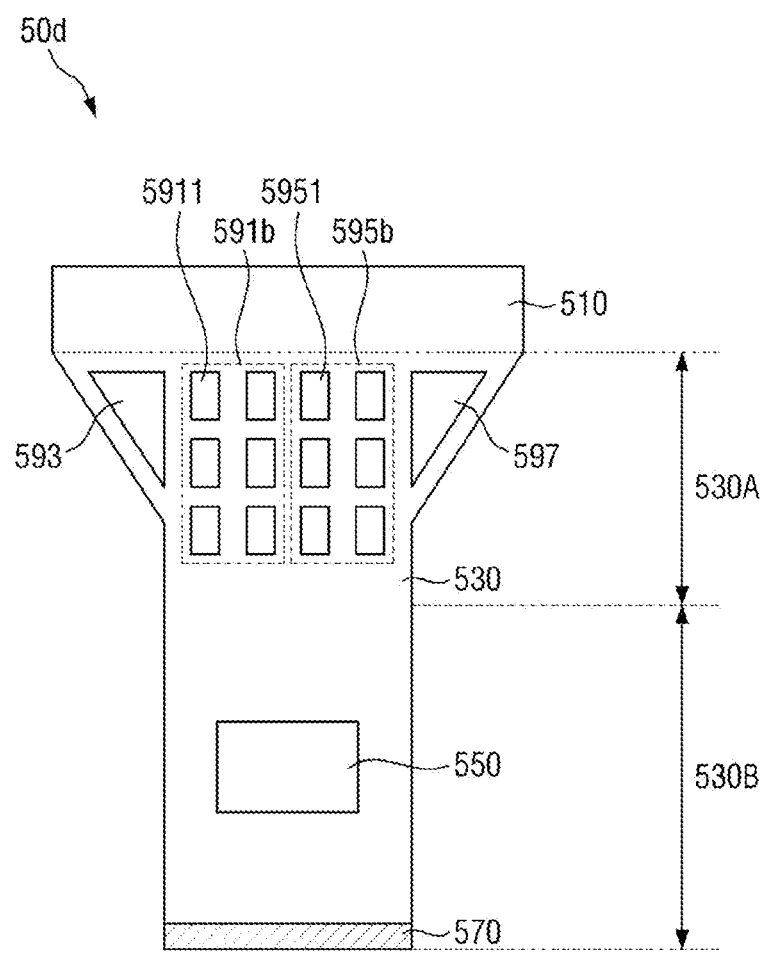
Figure 21:
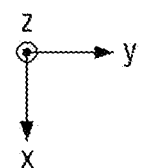

Referring to FIG. 21, a touch flexible circuit board 50d according to this modification embodiment is different from the touch flexible circuit board 50 shown in FIG. 3 in the shape of an opening member 59b, and other components of the touch flexible circuit board 50d are substantially the same as those of the touch flexible circuit board 50.

Specifically, the opening member 59b of the touch flexible circuit board 50d may include a first opening 591b, a second opening 593, a third opening 595b, and a fourth opening 597.

The first opening 591b may include a plurality of sub-openings 5911, and the planar shapes of the sub-openings 5911 may be substantially the same as each other. The sub-openings 5911 may be spaced apart from each other, and may be arranged along the row and column directions.

Similarly, the third opening 595b may also include a plurality of sub-openings 5951 spaced apart from each other in the row and column directions, and the planar shapes of the sub-openings 5951 may be substantially the same as each other.

Figure 22:
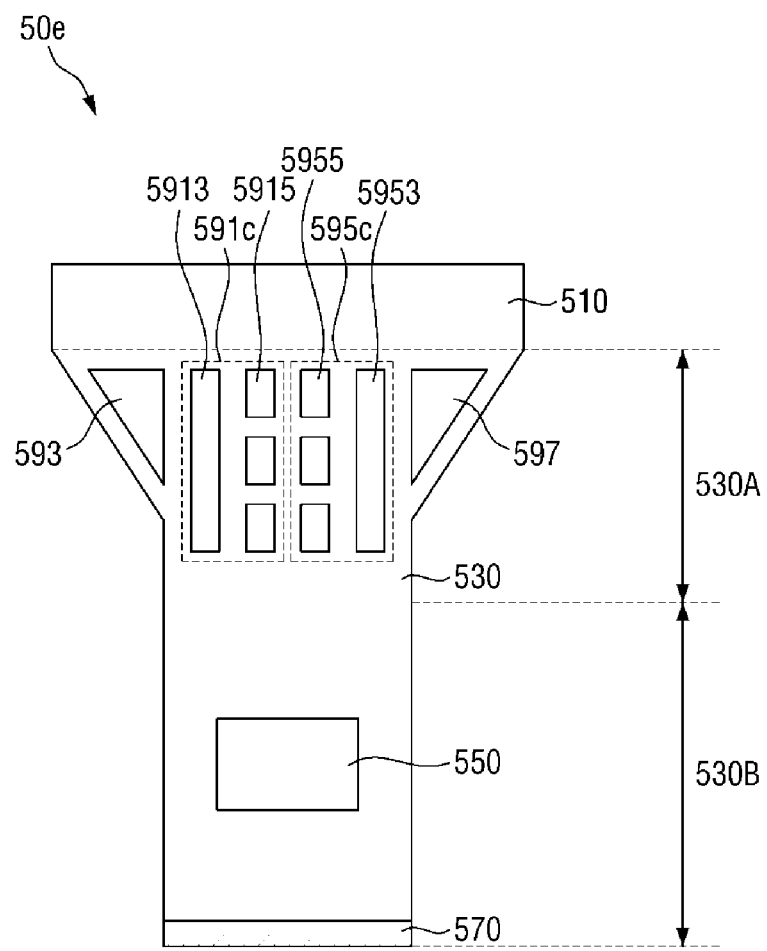

Referring to FIG. 22, a touch flexible circuit board 50e according to this modification embodiment is different from the touch flexible circuit board 50d shown in FIG. 21 in the shape of an opening member 59c, and other components of the touch flexible circuit board 50e are substantially the same as those of the touch flexible circuit board 50d.

The opening member 59c may include a first opening 591c, a second opening 593, a third opening 595c, and a fourth opening 597.

The first opening 591c includes a first sub-opening 5913 having a stripe shape and a plurality of second sub-openings 5915 having a smaller size than the first sub-opening 5913 and spaced apart from each other along the extension direction of the first sub-opening 5913. Similarly, the third opening 595c includes a third sub-opening 5953 having a stripe shape and a plurality of fourth sub-openings 5955 having a smaller size than the third sub-opening 5953 and spaced apart from each other along the extension direction of the third sub-opening 5953.

In some exemplary embodiments, as described above, the shape of the third opening 595c and the shape of the first opening 591c may be symmetrical to each other with respect to an imaginary line extending along the first direction x.

Figure 23:
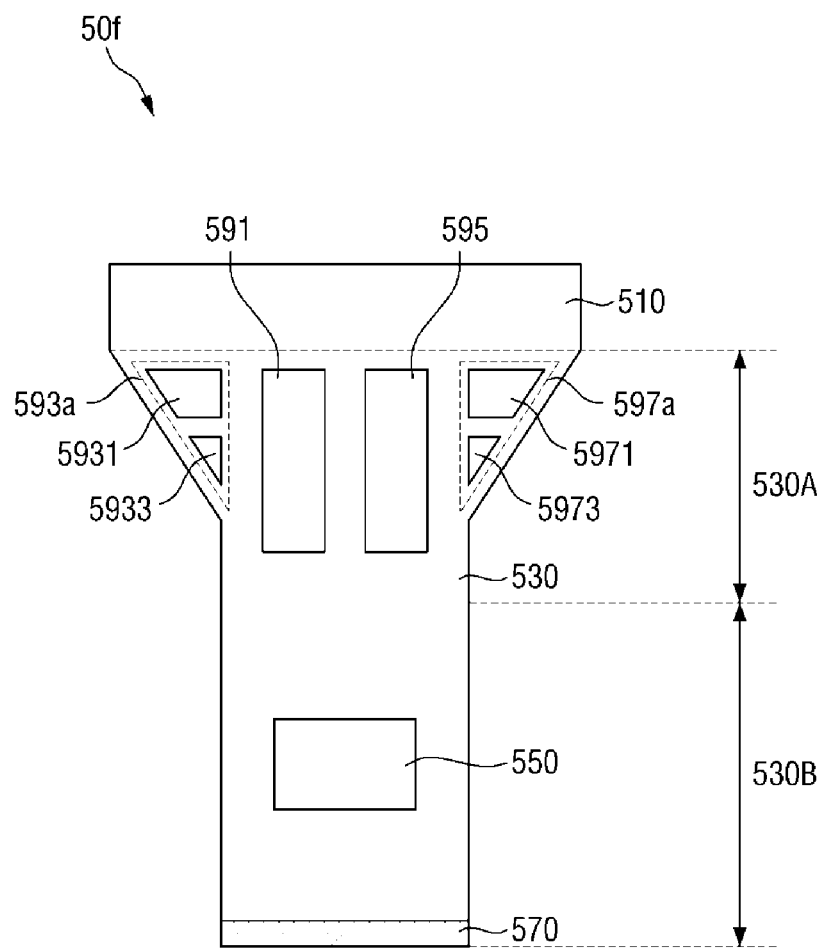
Figure 23:
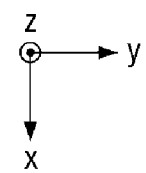

Referring to FIG. 23, a touch flexible circuit board 50f according to this modification embodiment is different from the touch flexible circuit board 50 shown in FIG. 3 in the shape of an opening member 59d, and other components of the touch flexible circuit board 50f are substantially the same as those of the touch flexible circuit board 50.

The opening member 59d may include a first opening 591, a second opening 593a, a third opening 595, and a fourth opening 597a.

The second opening 593a includes a plurality of sub-openings 5931 and 5933, unlike the second opening 593 shown in FIG. 3. In an exemplary embodiment, the second opening 593a may include a first sub-opening 5931 and a second sub-opening 5933 spaced apart from the first sub-opening 5931, for example. In an exemplary embodiment, the first sub-opening 5931 and the second sub-opening 5933 may be spaced from each other along the first direction x, for example, but the invention is not limited thereto. In some exemplary embodiments, the planar shape of the first sub-opening 5931 may be different from the planar shape of the second sub-opening 5933.

Similarly, the fourth opening 597a may include a third sub-opening 5971 and a fourth sub-opening 5973 spaced apart from the third sub-opening 5971. In some exemplary embodiments, the planar shape of the third sub-opening 5971 may be different from the planar shape of the fourth sub-opening 5973.

Figure 24:
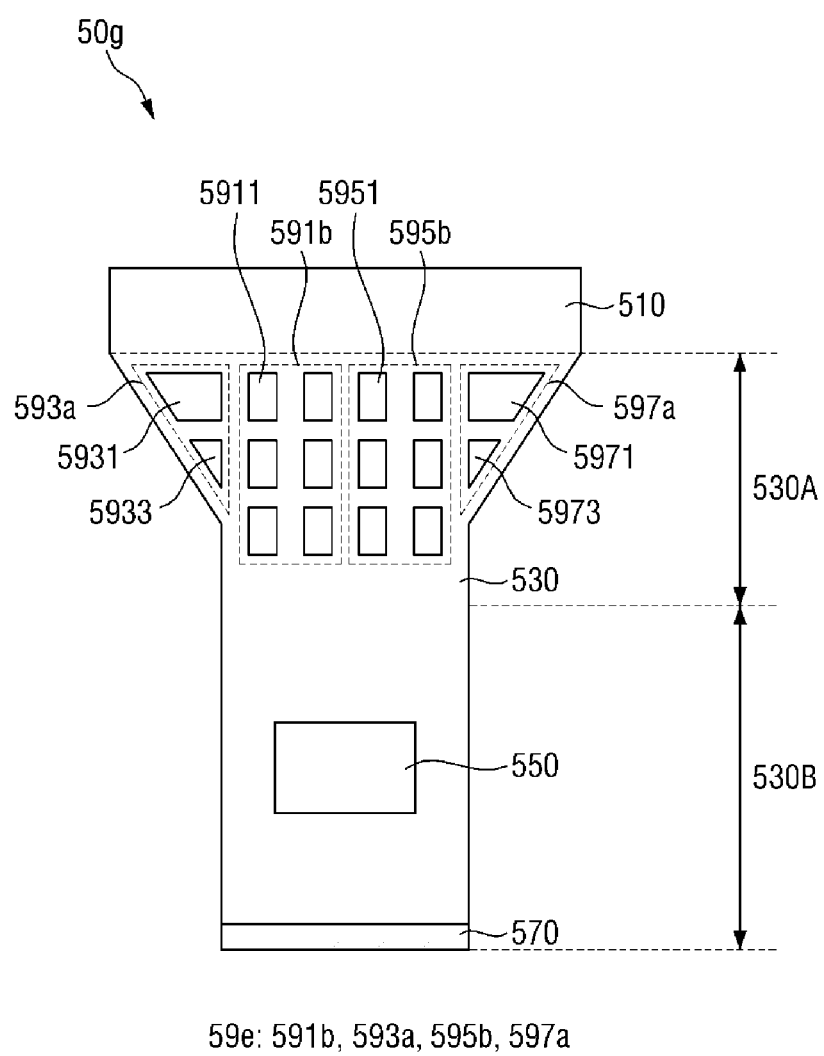
Figure 24:
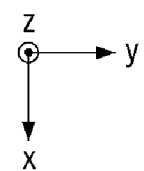

Referring to FIG. 24, a touch flexible circuit board 50g according to this modification embodiment is different from the touch flexible circuit board 50 shown in FIG. 3 in the shape of an opening member 59e, and other components of the touch flexible circuit board 50g are substantially the same as those of the touch flexible circuit board 50.

The opening member 59e may include a first opening 591b, a second opening 593a, a third opening 595b, and a fourth opening 597a.

A description of the first opening 591b and the third opening 595b is the same as that described with reference to FIG. 21, and a description of the second opening 593a and the fourth opening 597a is the same as that described in FIG. 23. Therefore, these descriptions will be omitted.

Figure 25:
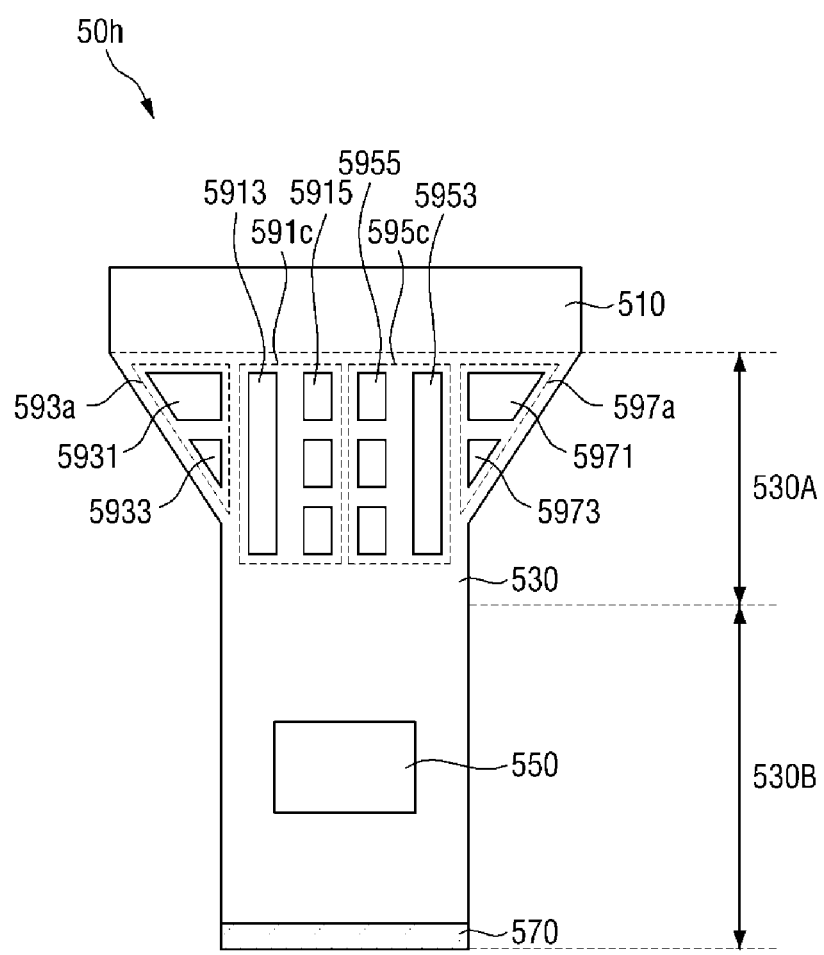
Figure 25:
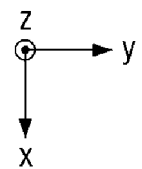

Referring to FIG. 25, a touch flexible circuit board 50h according to this modification embodiment is different from the touch flexible circuit board 50 shown in FIG. 3 in the shape of an opening member 59f, and other components of the touch flexible circuit board 50h are substantially the same as those of the touch flexible circuit board 50.

The opening member 59f may include a first opening 591c, a second opening 593a, a third opening 595c, and a fourth opening 597a.

A description of the first opening 591c and the third opening 595c is the same as that described with reference to FIG. 22, and a description of the second opening 593a and the fourth opening 597a is the same as that described in FIG. 23. Therefore, these descriptions will be omitted.

Although not shown in the drawings, each of the touch flexible circuit boards according to the modification embodiments, described with reference to FIGS. 21 to 25, may further include the UV transmitting resin layer 381 described with reference to FIGS. 14 to 16 or the UV transmitting resin layer 383 with reference to FIGS. 17 to 19.

As described above, according to the exemplary embodiments of the invention, there may be provided a display device having improved reliability.

Further, according to the exemplary embodiments of the invention, there may be provided a flexible circuit board capable of manufacturing a display device having improved reliability.

The effects of the invention are not limited by the foregoing, and other various effects are anticipated herein.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device, comprising:
   a display structure including:
      a display panel including:
         a display area; and
         a non-display area around the display area; and
      a touch sensing layer disposed on the display panel and including:
         a first portion overlapping the display area; and
         a second portion overlapping the non-display area;
   a window structure disposed on the display structure;
   a bonding layer disposed between the display structure and the window structure; and
   a touch flexible circuit board electrically connected with the touch sensing layer, the touch flexible circuit board including:
      a first substrate member connected to the second portion, and
      a second substrate member provided with an ultraviolet transmitting member which transmits ultraviolet light therethrough the touch flexible circuit board emitted from a side of the bonding layer, and the second substrate member extends from the first substrate member in a predetermined direction,
   wherein the second substrate member includes a bending portion extending from the first substrate member and an extension portion extending from the bending portion and disposed under the display structure, and
   the ultraviolet transmitting member is defined at the bending portion.

2. The display device of claim 1,
   wherein the ultraviolet transmitting member does not overlap the touch sensing layer.

3. The display device of claim 1,
   wherein the bending portion does not overlap the touch sensing layer.

4. The display device of claim 1,
   wherein the touch flexible circuit board further includes a touch driver disposed on the extension portion.

5. The display device of claim 1, further comprising:
   a panel flexible circuit board connected to the display panel in the non-display area and bent toward a lower side of the display structure,
   wherein the touch flexible circuit board is connected with the panel flexible circuit board under the display structure.

6. The display device of claim 1,
   wherein the ultraviolet transmitting member is an opening member defined in the second substrate member.

7. The display device of claim 6,
   wherein the opening member includes a first opening and a second opening located adjacent to an edge of the second substrate member compared to the first opening and having a different planar shape from that of the first opening.

8. The display device of claim 6,
   wherein the opening member has an edge provided with irregularities in a plan view.

9. The display device of claim 6,
   wherein the touch flexible circuit board further includes an ultraviolet transmitting resin layer provided in the opening member.

10. The display device of claim 9,
    wherein a part of the ultraviolet transmitting resin layer is in contact with at least one of upper and lower surfaces of the second substrate member.

11. The display device of claim 9,
    wherein the ultraviolet transmitting resin layer includes light scattering particles.

12. The display device of claim 1,
    wherein the bonding layer includes an ultraviolet-curable resin.

13. The display device of claim 12,
    wherein the bonding layer covers a part of the first substrate member.

14. The display device of claim 1,
    wherein the display panel includes a first substrate, a second substrate disposed on the first substrate, and a light emitting element disposed between the first substrate and the second substrate, and
    the touch sensing layer is directly disposed on the second substrate.

15. The display device of claim 1, further comprising:
    an optical member disposed on the display structure,
    wherein the bonding layer is disposed between the window structure and the optical member and is in contact with an upper surface of the optical member.

16. The display device of claim 15,
    wherein the bonding layer is further in contact with a side surface of the optical member.

17. The display device of claim 16,
    wherein the bonding layer is further in contact with a portion between the first substrate member and the side surface of the optical member of the upper surface of the optical member.

18. The display device of claim 17,
wherein the bonding layer is further in contact with a part of the first substrate member.

19. The display device of claim 15,
wherein the optical member includes a polarization member.

20. The display device of claim 1,
wherein the window structure includes a window disposed on the display structure and a light blocking member disposed on one surface of the window facing the display structure and overlapping the ultraviolet transmitting member.

21. The display device of claim 1, further comprising:
a panel protection member disposed under the display structure and connected to the display panel,
wherein a part of the second substrate member disposed under the panel protection member.

\* \* \* \* \*